United States Patent
Tsuruta et al.

(10) Patent No.: US 6,790,751 B2
(45) Date of Patent: Sep. 14, 2004

(54) SEMICONDUCTOR SUBSTRATE FOR A ONE-CHIP ELECTRONIC DEVICE AND RELATED MANUFACTURING METHOD

(75) Inventors: Kazuhiro Tsuruta, Nishio (JP); Nobuaki Kawahara, Nisshin (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 10/259,580

(22) Filed: Sep. 30, 2002

(65) Prior Publication Data

US 2003/0067014 A1 Apr. 10, 2003

(30) Foreign Application Priority Data

Oct. 4, 2001 (JP) ........................................ 2001-308496
Jan. 17, 2002 (JP) ........................................ 2002-009220

(51) Int. Cl.$^7$ ............................................. H01L 21/425
(52) U.S. Cl. ........................ 438/524; 438/303; 438/199; 438/427; 438/462; 257/528
(58) Field of Search ................................. 438/524, 303, 438/199, 427, 462; 257/528

(56) References Cited

U.S. PATENT DOCUMENTS

| 4,139,442 A | | 2/1979 | Bondur et al. |
| 4,369,565 A | * | 1/1983 | Muramatsu ................. 438/430 |
| 4,735,824 A | * | 4/1988 | Yamabe et al. .............. 427/79 |
| 5,316,962 A | * | 5/1994 | Matsuo et al. .............. 438/245 |
| 5,658,816 A | * | 8/1997 | Rajeevakumar ............ 438/386 |
| 5,665,622 A | * | 9/1997 | Muller et al. ............... 438/243 |

2002/0072183 A1 * 6/2002 Iba et al. .................... 438/303

FOREIGN PATENT DOCUMENTS

| DE | 2949360 | 6/1980 |
| JP | 54-043839 | 4/1979 |
| JP | 55-078540 | 6/1980 |
| JP | 2001-77315 | 3/2001 |

OTHER PUBLICATIONS

"Large Suspended Inductors on Silicon and Their Use in a 2–$\mu$m CMOS RF Amplifier" by J. Y.—C. Chang, et al; IEEE Electron Device Letters, vol. 14, No. 5, May 1993; pp. 246–248.

H.B. Erzgtaber et al.; "A Novel Buried Oxide Isolation for Monolithic RF Inductors on Silicon" 1998 IEEE IEDM 98–535–539.

* cited by examiner

Primary Examiner—David Nelms
Assistant Examiner—Long Tran
(74) Attorney, Agent, or Firm—Posz & Bethards, PLC

(57) ABSTRACT

A plurality of grooves, each having a depth of 10 $\mu$m or more and arranged adjacent to each other, are formed at a predetermined portion of a semiconductor substrate where a passive element is formed. Then, a thermal oxidation treatment is performed to let an oxide film grow from an inside surface of each groove so as to fill an inside space of the groove with a thermal oxide film thus grown and turn an entire portion intervening between adjacent grooves into a thermal oxide layer. Each groove has a width of 1 $\mu$m or less, and a width of a semiconductor material intervening between two adjacent grooves is 81.8% or more with respect to the groove width.

17 Claims, 14 Drawing Sheets

20 SOI SUBSTRATE

SEMICONDUCTOR SUBSTRATE FOR A ONE-CHIP ELECTRONIC DEVICE AND RELATED MANUFACTURING METHOD

BACKGROUND OF THE INVENTION

This invention relates to a semiconductor substrate for a one-chip electronic device and its manufacturing method.

The spread and popularization of portable telephones and other compact wireless communication devices has increased the needs to downsizing, low-power consumption, and cost reduction of high frequency circuits incorporated in these devices. To this end, a monolithic IC has been recently developed as a one chip electronic device incorporating active elements, such as transistors and diodes, as well as passive elements, such as resistors, capacitors, and inductors, which are integrated on a semiconductor substrate, especially on a silicon substrate, together with various circuits including high-frequency oscillators, amplifiers and filter circuits.

However, when the inductors are formed on semiconductor substrates, the problem arises in that parasitic capacitance and parasitic resistance (i.e., eddy current loss) are produced between electric conductors, constituting the inductor, and the semiconductor substrates, as described in "Large Suspended Inductors on Silicon and Their Use in a 2-$\mu$m CMOS RF Amplifier," by J. Y. C. Chang et al., IEEE Electron Device Letters, Vol. 14, No.5, pp.246–248 (1993). Accordingly, a key for obtaining the inductors having high Q (quality factor) is to reduce the parasitic capacitance and the parasitic resistance.

To solve this problem, Chang et al. propose to form a groove (i.e., a cavity) under an inductor disposed on the surface of a semiconductor substrate. However, this arrangement brings the following problems.

First, the process of removing a silicon region located under the inductor by etching is inconsistent with the conventionally and widely used silicon LSI manufacturing processes. Second, according to the above-described arrangement, a mechanical strength of the insulator is insufficient due to an aerial wiring structure of the inductor.

To solve the above-described problem, the unexamined Japanese patent publication 2001-77315 discloses an IC device including a groove having a depth of 20 $\mu$m or more formed partly on a semiconductor substrate. According to this prior art, the groove is filled with an insulating material. Active elements, including inductors, are formed on the surface of the insulating material thus filled into the groove. This arrangement makes it possible to effectively reduce the parasitic capacitance and the parasitic resistance residing between the electric conductor constituting the inductor and the semiconductor substrate. This arrangement provides good matching with the conventional silicon LSI manufacturing processes and accordingly assures a sufficient strength.

However, according to the method disclosed in the unexamined Japanese patent publication 2001-77315, the insulating material is an organic insulating fluid which causes the following problems.

In general, this kind of insulating fluid causes a volumetric change (i.e., volumetric shrinkage) in the process of self-hardening. This possibly causes an altitudinal difference between a semiconductor substrate surface on which the active elements are formed and an upper surface of the shrunken insulating material on which the passive elements are formed. Furthermore, the upper surface of the shrunken insulating material is not flat. The volumetric change possibly produces a stress acting on the substrate which results in warp of the substrate. To flatten the upper surface of the shrunken insulating material, this prior art discloses a method for removing an excessive insulating material other than the groove according to the CMP (Chemical-Mechanical Polishing). However, manufacturing processes of the IC device become complicated.

SUMMARY OF THE INVENTION

In view of the foregoing problems of the prior art, the present invention has an object to provide a novel semiconductor substrate capable of sufficiently reducing the parasitic capacitance and the parasitic resistance and also assuring a sufficient strength for an insulating layer, which is preferably applicable to a semiconductor device comprising active and passive elements formed on the semiconductor substrate.

Another object of the present invention is to provide a related manufacturing method of the semiconductor substrate.

To accomplish the above and other related objects, the present invention provides a semiconductor substrate comprising a passive element disposed on an insulating member, an active element formed in a surficial region of the insulating member, and a thermal oxide layer formed at a region corresponding to the passive element, the thermal oxide layer having a thickness of 10 $\mu$m or more.

Providing the thermal oxide layer having the thickness of 10 $\mu$m or more is effective to sufficiently reduce the parasitic capacitance and the parasitic resistance. As the passive elements do not employ an aerial wiring structure, it becomes possible to assure a sufficient mechanical strength.

According to the semiconductor substrate of the present invention, it is preferable that the semiconductor substrate is an SOI (Silicon On Insulator) substrate. It is also preferable that the passive element is operative at high frequencies.

It is also preferable that a cavity is formed inside the thermal oxide layer. For example, the cavity has a relative dielectric constant of approximately 1 which is fairly smaller than 3.9 of the silicon dioxide. It becomes possible to reduce the parasitic capacitance compared with the one having no cavity. As a result, it becomes possible to obtain the effect of reducing transmission loss with a relatively thin thermal oxide layer.

The present invention provides a first method for manufacturing a semiconductor substrate comprising a passive element disposed on an insulating member and an active element formed in a surficial region of the insulating member. The first manufacturing method comprises a step of forming a groove having a depth of 10 $\mu$m or more at a predetermined portion of the semiconductor substrate where the passive element is formed, and a step of performing a thermal oxidation treatment to let an oxide film grow from an inside surface of the groove so as to fill an inside space of the groove with a thermal oxide film thus grown.

The present invention provides a second method for manufacturing a semiconductor substrate comprising a passive element disposed on an insulating member and an active element formed in a surficial region of the insulating member. The second manufacturing method comprises a step of forming a plurality of grooves each having a depth of 10 $\mu$m or more and arranged adjacent to each other at a predetermined portion of the semiconductor substrate where the passive element is formed, and a step of performing a thermal oxidation treatment to let an oxide film grow from an inside surface of the groove so as to fill an inside space of the groove with a thermal oxide film thus grown and turn an entire portion intervening between adjacent grooves into a thermal oxide layer.

According to the first and second manufacturing methods, the oxide film grows and fills the inside space of the groove in the process of forming the thermal oxide layer. Thus, no stress is applied to the substrate material when the oxide film causes volumetric expansion. The semiconductor substrate is not suffered with warp. Furthermore, the thick thermal oxide layer has a flat surface substantially level with the semiconductor substrate surface. The thermal oxide layer can be formed at a desired region. No special flattening process is required. Furthermore, the first and second manufacturing methods of the present invention makes it possible to manufacture a great amount of semiconductor substrates without changing the conventional LSI manufacturing processes. This makes it possible to realize a mass production of high-performance semiconductor devices.

According to the first or second manufacturing method of the present invention, it is preferable that each groove has a width of 10 μm or less, and the width of a semiconductor material intervening between two adjacent grooves is 81.8% or more with respect to the groove width. This ensures that the groove is completely filled with the thermal oxide film.

Furthermore, it is preferable that the first or second manufacturing method of the present invention further comprises a step of forming a laterally extending bore for connecting adjacent grooves at a bottom region thereof so as to leave a cavity tying the plurality of grooves in a row, after accomplishing the step of forming the plurality of grooves arranged adjacent to each other. And, the thermal oxidation treatment is performed to let the oxide film grow from an inside surface of the cavity as well as from the inside space of the groove so as to fill the inside space of the groove with the thermal oxide film thus grown and leave a closed cavity shrunken from the cavity.

Furthermore, it is preferable that the first or second manufacturing method of the present invention further comprises a step of forming a laterally extending bore for connecting adjacent grooves at a bottom region thereof so as to leave a cavity tying the plurality of grooves in a row, after accomplishing the step of forming the plurality of grooves arranged adjacent to each other. And, the thermal oxidation treatment is performed to let the oxide film grow from an inside surface of the cavity as well as from the inside space of the groove so as to fill the inside space of the groove with the thermal oxide film thus grown and turn an entire portion intervening between adjacent grooves into a thermal oxide layer, and finally leave a closed cavity shrunken from the cavity.

Furthermore, the present invention provides a third method for manufacturing a semiconductor substrate comprising a passive element disposed on an insulating member and an active element formed in a surficial region of the insulating member. The third manufacturing method comprises a step of forming a plurality of grooves each having a depth of 10 μm or more and arranged adjacent to each other at a predetermined portion of the semiconductor substrate where the passive element is formed, a step of performing a thermal oxidation treatment to let an oxide film grow from an inside surface of the groove so as to incompletely fill an inside space of the groove with a thermal oxide film thus grown and turn an entire portion intervening between adjacent grooves into a thermal oxide layer, and a step of filling a narrowed groove incompletely shrunken from the groove with an insulating material.

It is preferable that the third manufacturing method of the present invention further comprises a step of forming a laterally extending bore for connecting adjacent grooves at a bottom region thereof so as to leave a cavity tying the plurality of grooves in a row, after accomplishing the step of forming the plurality of grooves arranged adjacent to each other. And, the thermal oxidation treatment is performed to let the oxide film grow from an inside surface of the cavity as well as from the inside space of the groove so as to incompletely fill the inside space of the groove with the thermal oxide film thus grown and turn an entire portion intervening between adjacent grooves into a thermal oxide layer, and finally leave a closed cavity shrunken from the cavity.

According to the third manufacturing method of the present invention, it is preferable that a width of a semiconductor material intervening between two adjacent grooves is 81.8% or less with respect to a groove width of the groove.

According to the third manufacturing method of the present invention, it is preferable that the thermal oxidation treatment is performed together with a thermal oxidation treatment performed for forming an element separating oxide film on an upper surface of the semiconductor substrate.

According to the third manufacturing method of the present invention, it is preferable that the thermal oxidation treatment is performed in an oxidizing atmosphere containing hydrogen at 965° C. or above. It is especially preferable that the thermal oxidation treatment is performed in an oxidizing atmosphere containing hydrogen at 1,100° C. or above.

Moreover, it is preferable that a reactive ion etching or a plasma etching is used in the step of forming the groove. For example, the anisotropic etching such as the reactive ion etching using a fluorine group gas, especially the high-density plasma etching, ensures that a resultant groove has a depth of 10 μm or more and a width of 1 μm or less so as to extend perpendicularly to the substrate surface.

According to the third manufacturing method of the present invention, it is preferable that the semiconductor substrate is an SOI (Silicon On Insulator) substrate and the passive element is operative at high frequencies.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF PREFERRED EMBODIMENTS

Hereinafter, preferred embodiments of the present invention will be explained with reference to attached drawings.

First Embodiment

Figure 1:
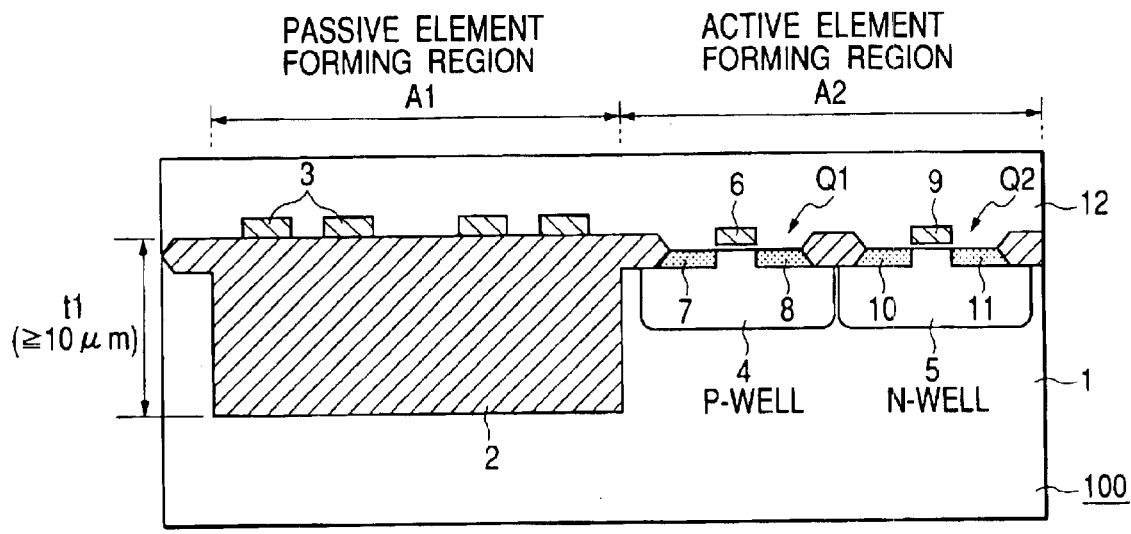
FIG. 1 is a vertical cross-sectional view partly showing the arrangement of a monolithic IC in accordance with a first embodiment of the present invention.

The semiconductor device in accordance with this embodiment is a high-frequency monolithic IC. FIG. 1 is a vertical cross-sectional view partly showing a high-frequency monolithic IC comprising a thick thermal oxide layer 2 formed partly on a semiconductor substrate 100. The semiconductor substrate 100 has an element forming surface on which various electronic elements are provided or disposed. The thermal oxide layer 2 is an insulating member on which passive elements are disposed.

As shown in FIG. 1, transistors Q1 and Q2 serving as active elements and inductors 3 serving as a passive element are integrated on the semiconductor substrate 100, so as to form a single chip together with the circuitry constituting, for example, a high-frequency oscillator, amplifiers, and filters.

More specifically, as shown in FIG. 1, an upper surface of a silicon substrate 1 includes a passive element forming region A1 and an active element forming region A2. The thermal oxide layer 2, having the thickness (i.e., depth) of 10 $\mu$m or more, is formed so as to correspond to the passive element forming region A1. The inductors 3, e.g., a spiral inductor, are formed on the thermal oxide layer 2. In general, when the substrate 1 is incorporated in a high-frequency device, a portion immediately beneath the spiral inductors 3 is subjected to strong electromagnetic waves. This is the reason why the thickness t1 of the thermal oxide layer 2 is not smaller than 10 $\mu$m. Preferably, the thickness t1 of thermal oxide layer 2 is 30 $\mu$m. The silicon thermal oxide film, constituting the thermal oxide layer 2, has a relative dielectric constant of approximately 3.9. The spiral inductor 3 is made of a metallic material, such as aluminum (Al) serving as wiring material, copper (Cu), and gold (Au). The active elements, e.g., N-channel MOS transistor Q1 and P-channel MOS transistor Q2, are formed within the active element forming region A2 on the silicon substrate 1.

Hereinafter, the manufacturing processes of the monolithic IC will be explained with reference to FIGS. 2A–2B and 3A–3C.

Figure 2A:
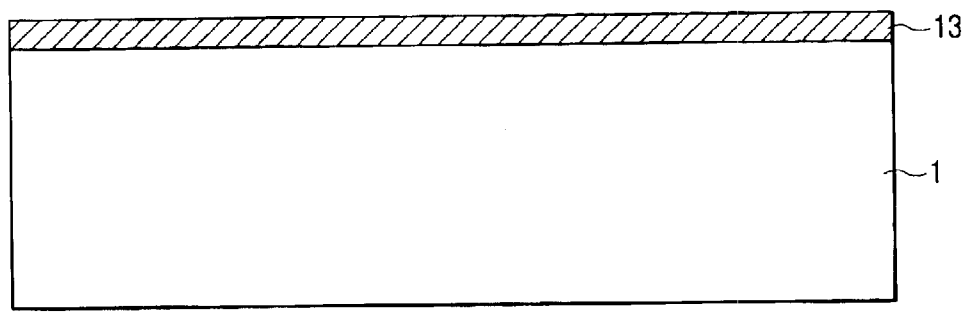
FIG. 2A is a cross-sectional view showing a manufacturing process of the monolithic IC in accordance with the first embodiment of the present invention.
Figure 2B:
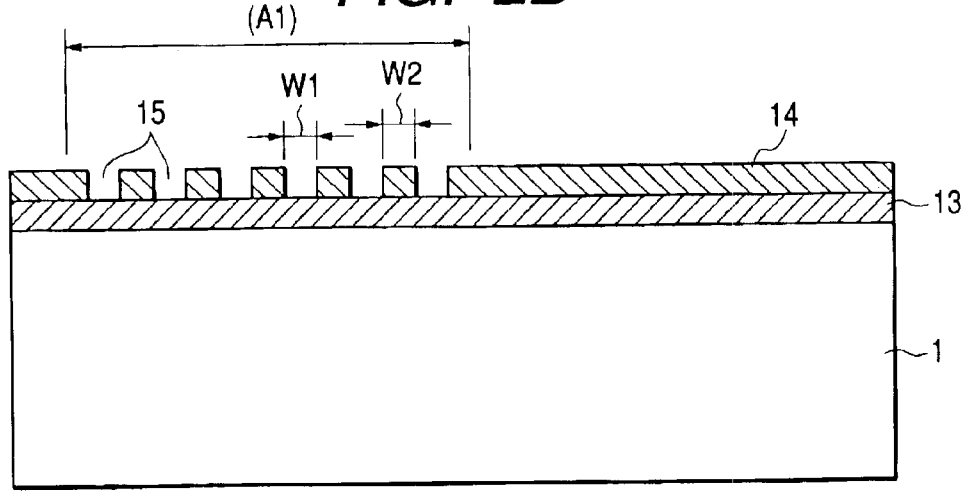
FIG. 2B is a cross-sectional view showing a manufacturing process of the monolithic IC in accordance with the first embodiment of the present invention.
Figure 4A:
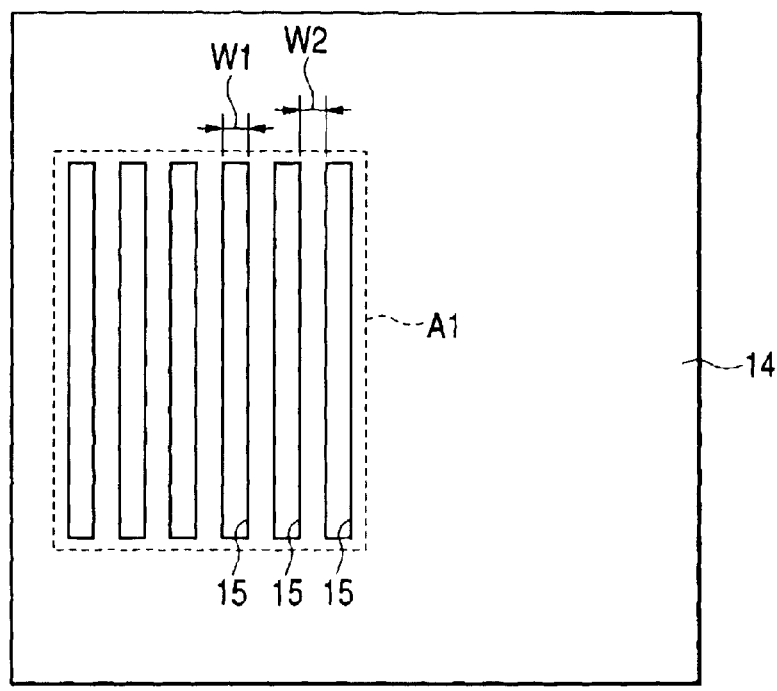
FIG. 4A is a plan view showing a manufacturing process of the monolithic IC in accordance with the first embodiment of the present invention.

First of all, as shown in FIG. 2A, an oxide film ($SiO_2$) 13 is formed on a prepared silicon substrate 1. Then, as shown in FIG. 2B, a photo resist 14 is coated on the oxide film 13. Then, the photo resist 14 is subjected to the exposure of light having a predetermined stripe pattern to leave parallel apertures 15 each having a width W1 of 1 μm or less. A width W2 of an intervening portion between two adjacent apertures 15 is 81.8% or more with respect to the width W1 of each aperture 15 (i.e., W2≧0.818×W1). FIG. 4A is a plan view showing from above the parallel apertures 15 thus formed on the photo resist 14.

Figure 3A:
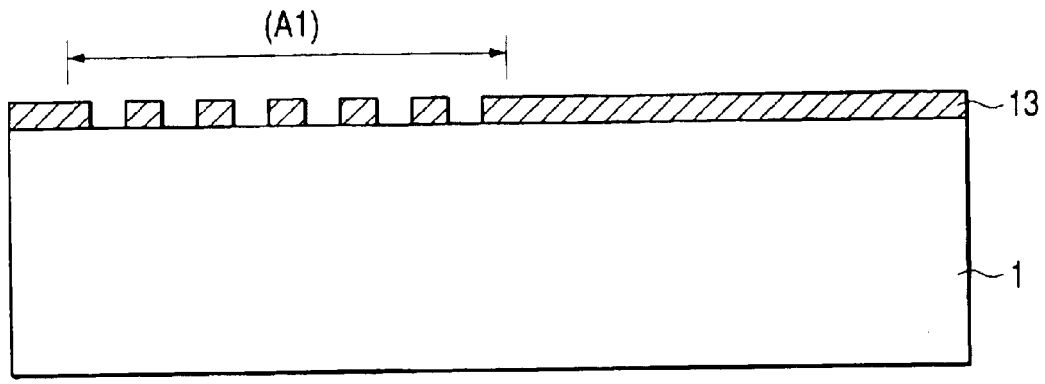
FIG. 3A is a cross-sectional view showing a manufacturing process of the monolithic IC in accordance with the first embodiment of the present invention.

Thereafter, as shown in FIG. 3A, the oxide film 13 is etched by using the stripe pattern thus formed with the photo resist 14. Then, the photo resist 14 is removed off to leave the oxide film 13 having been thus patterned as a mask. At this moment, the portions of silicon substrate 1 to be etched are just exposed.

Figure 3B:
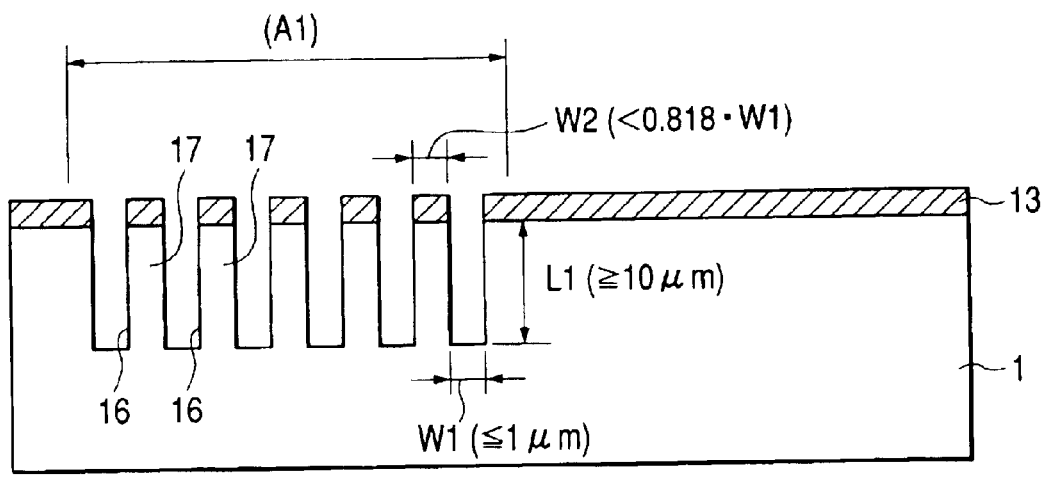
FIG. 3B is a cross-sectional view showing a manufacturing process of the monolithic IC in accordance with the first embodiment of the present invention.

Next, as shown in FIG. 3B, an anisotropic etching is applied to the silicon substrate 1 to form a plurality of grooves 16 arranged in the stripe pattern defined by the mask of oxide film 13. According to this embodiment, each groove 16 has a depth L1 of 10 μm or more. To this end, it is preferable that the anisotropic etching is the reactive ion etching using a fluorine group gas, especially high-density plasma etching. This ensures that the resultant groove 16 has a sufficient depth of 10 μm or more and a width of 1 μm or less so as to extend perpendicularly to the substrate surface (i.e., the upper surface of silicon substrate 1).

It is also possible to utilize the etching technique disclosed in the unexamined Japanese patent publication 2000-299310, according to which a protective oxide film is formed on an inside surface (i.e., both a side surface and a bottom surface) of the resultant groove. Then, the reactive ion etching is applied only to the oxide film formed on the bottom surface of the groove to expose the silicon substrate at a trench bottom (i.e., a portion corresponding to the bottom of the groove). Then, the etching is applied to the exposed silicon substrate (in other words, the etching of the silicon substrate 1 resumes) so as to deepen the depth of the groove 16 while keeping the previously formed wall of the groove unchanged. In this manner, the process of forming a protective oxide film and the process of etching the trench bottom are repeated alternately. Using this etching technique makes it possible to form a deep groove having an aspect ratio of 30 or more. For example, the resultant groove 16 is a straight groove extending perpendicularly to the substrate surface with the depth of 30 μm or more even if the groove width is 1 μm or less.

Furthermore, in FIG. 3B, a silicon material 17 intervening between two adjacent grooves 16 has a width W2 which is 81.8% or more with respect to the groove width W1. The height L1 of the silicon material 17 is 10 μm or more. Thus, each silicon material 17 looks like a thin plate.

Figure 3C:
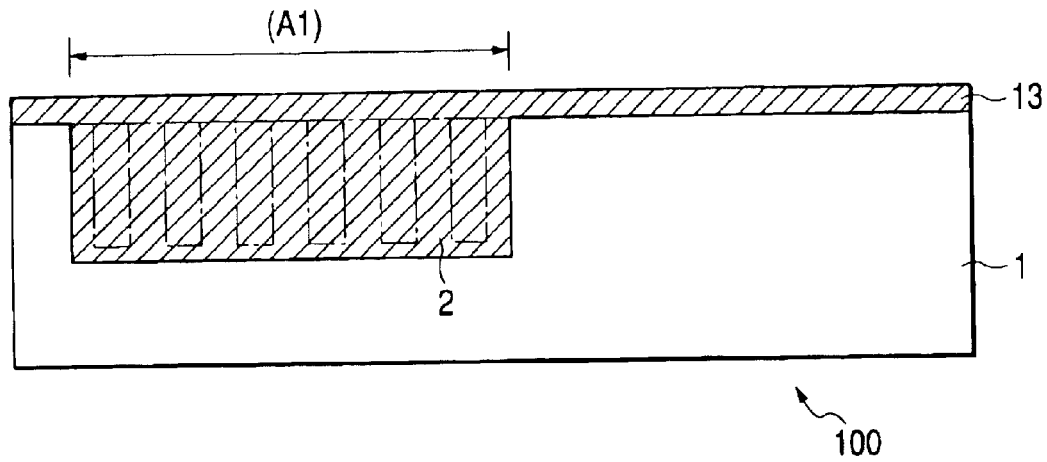
FIG. 3C is a cross-sectional view showing a manufacturing process of the monolithic IC in accordance with the first embodiment of the present invention.

Next, the substrate 1 is subjected to an oxidation treatment at 965° C. or above in an oxidizing atmosphere containing hydrogen, such as wet $O_2$, steam $O_2$, or a combustion mixture of $H_2$ and $O_2$. As a result, as shown in FIG. 3C, a thermal oxide layer 2 is formed in the substrate 1. In the process of this oxidation treatment, the oxidation advances in each silicon material 17 intervening two adjacent grooves 16 while an oxide film grows from an inside surface of the groove 16. The silicon material 17 turns into a silicon dioxide at the rate of 45% with respect to the overall thickness of the oxide film. Meanwhile, the oxide film growing in the groove 16 has a thickness equivalent to 55% with respect to the overall oxide film thickness. Accordingly, the oxidation advances in such a manner that the growing oxide film gradually fills the inside space of groove 16 until the outermost surfaces of the oxide films growing from opposed walls of the groove 16 merge with each other. In this manner, as a result of the oxidation treatment, the inside space of the groove 16 is completely filled with the oxide layer (i.e., silicon dioxide) 2. Namely, when the width W2 is set to be equal to or larger than (45/55)×W1 (i.e., when W2≧0.818×W1) in FIG. 3B, it is possible to allow the growing oxide film to completely fill the inside space of groove 16.

The contribution of hydrogen is necessary in the process of merging (i.e., binding) of the oxide films advancing from opposed directions. This is the reason why the oxidation treatment is performed in the oxidizing atmosphere containing hydrogen. More specifically, the oxidizing atmosphere containing hydrogen is definitely necessary immediately before the oxide films merge and is no longer necessary after the groove 16 is completely filled with the oxide. In other words, dry $O_2$ or any other oxidizing atmosphere containing no hydrogen can be used in the rest of the oxidation treatment (i.e., other than the above specific duration).

Furthermore, when the width W2 of the thin platelike silicon material 17 is substantially 81.8% with respect to the width W1 of the groove 16, all of the silicon material 17 has just accomplished the oxidation (i.e., thoroughly tuns into a silicon dioxide) at the time the groove 16 is just completely filled with the oxide layer. Thus, the thermal oxide layer 2 having a thickness of 10 μm or more is formed in the entire region of the grooves 16 being arranged in a stripe pattern.

Figure 4B:
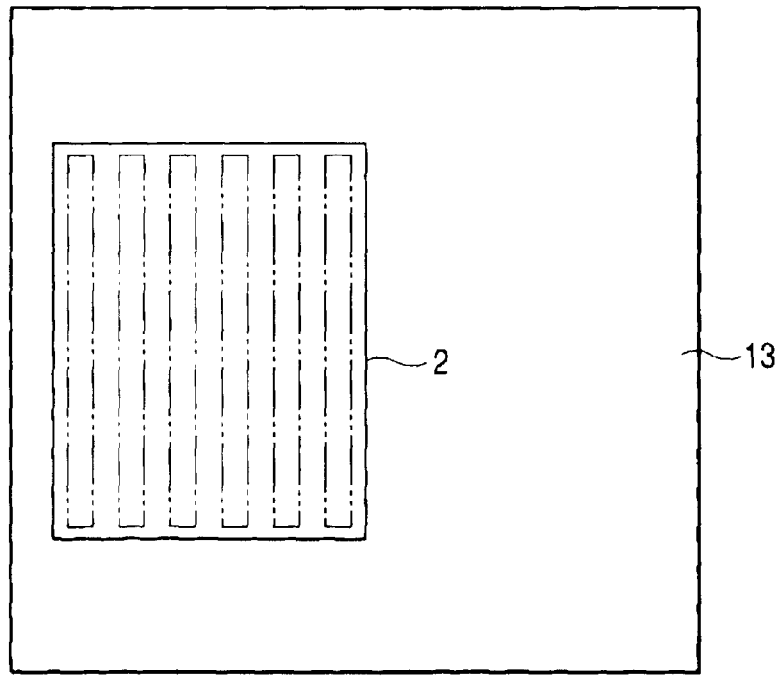
FIG. 4B is a plan view showing a manufacturing process of the monolithic IC in accordance with the first embodiment of the present invention.

FIG. 4B is a plan view showing from above the thermal oxide layer 2 thus formed on the substrate 100.

In this embodiment, the oxidization treatment is performed at 965° C. or above. Setting the oxidization treatment temperature to this level assures the formation of the oxide film on the silicon substrate 1 with a relatively lower stress given to the silicon substrate 1 due to the effect of viscous flow of the oxide film during the oxidation treatment. The oxide layer 2 grows and fills the inside space of the groove, while giving substantially no stress on the silicon substrate 1 during a volumetric expansion of the oxide film. Hence, the warp of silicon substrate 1 does not arise even when the thickness (i.e., the depth) of thus formed oxide layer 2 exceeds 10 μm.

The oxidation treatment of this embodiment is performed under the condition where the oxide film (i.e., mask) 13 is left as shown in FIG. 2A. However, it is possible to remove the oxide film 13 by etching prior to the oxidation treatment shown in FIG. 3C.

Depending on the etching conditions, the step of forming the grooves 16 shown in FIG. 3B may leave tiny roughness on the surface of each groove 16 due to damage caused during the etching. The uppermost end (i.e., the corner edge) of the groove 16 may deform into a dull angled edge. This may induce nonuniform formation of the oxide film growing from the groove surface. The nonuniform formation of the oxide film may result in incomplete growth of the oxide layer 2 which leaves a unwanted cavity in the groove 16. If the cavity does not give serious influence to the later-performed LSI processes, the cavity can be left in this condition. However, there is the possibility that any chemicals dissolved water may remain in this cavity. This will become a contamination source. Or, expansion of the cavity during the heat treatment may lead to fatal damage of the substrate 1. To avoid these problems, it is preferable to add a process of correcting the groove shape prior to the oxidation treatment shown in FIG. 3C. For example, the correcting process includes a step of forming an oxide film of approximately 0.1 μm on the groove surface and a step of removing the thus formed oxide film by etching to smoothen the groove surface. Adding this correcting process ensures that the groove 16 is completely filled with the thermal oxide.

Furthermore, as another method for completely filling the groove 16 with the oxide layer, it is also preferable to perform the process of forming the grooves 16 shown in FIG. 3B in such a manner that the groove width W1 is gradually widened as its altitudinal position approaches the substrate surface (i.e., the upper surface of silicon substrate 1). Each groove 16 is formed into a bellmouth shape.

Furthermore, when the temperature of the oxidation treatment shown in FIG. 3C is increased to 1,100° C. or above, it becomes more easy for the oxide film to smoothly and completely fill the groove 16 due to enhanced viscous flow of the oxide film.

When the aspect ratio of the groove 16 is set to a large value in the oxidation process shown in FIG. 3C, there is the possibility that the oxidizing atmosphere cannot reach the bottom of the groove 16 due to the presence of another atmosphere used in the preceding process (such as air, nitrogen, argon, or any other inert atmosphere). In such a case, the oxidation does not advance satisfactorily. To avoid this problem, it is preferable to first put the substrate 1 in a vacuum and then put the substrate 1 in an oxygen atmosphere to fully charge the oxygen into the groove 16.

The surface of the thick thermal oxide layer 2 thus formed is flat. The thermal oxide layer having the thickness of 10 μm or more has a sufficient strength. Accordingly, the ordinary LSI manufacturing processes can be applied to the semiconductor substrate 100 so as to form or provide the active elements Q1, Q2 (i.e., MOS transistors) on the silicon substrate 1 and the passive element 3 (i.e., spiral inductor) on the thermal oxide layer 2, thereby constituting the monolithic IC shown in FIG. 1. More specifically, a P-well region 4 and an N-well region 5 are formed in the surficial region of the silicon substrate 1. A gate electrode 6 is disposed on the P-well region 4 via a gate insulating film. And then, a source region 7 and a drain region 8 are formed on the P-well region 4. Similarly, a gate electrode 9 is disposed on the N-well region 5 via a gate insulating film. And then, a source region 10 and a drain region 11 are formed on the N-well region 5. Thereafter, a passivation film 12 is formed to cover the passive elements (i.e., spiral inductors) 3, other metallic wiring, and the substrate surface.

Figure 5A:
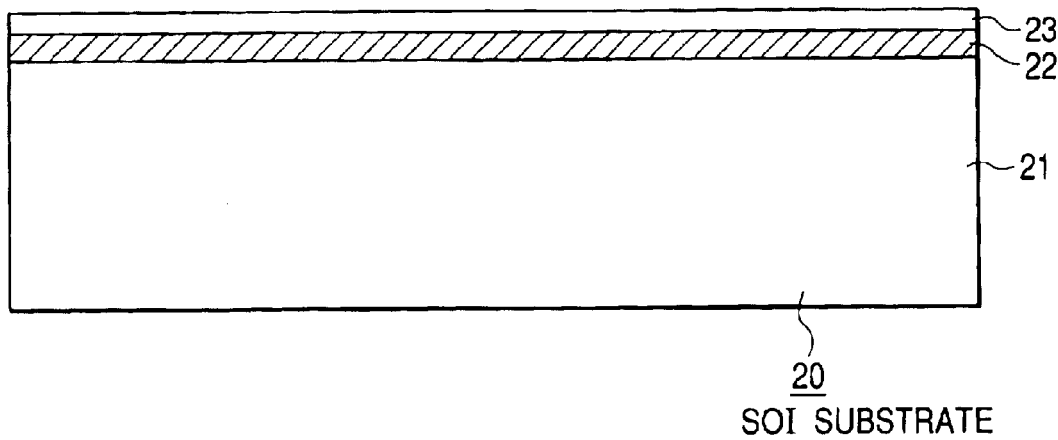
FIG. 5A is a cross-sectional view showing a manufacturing process of the monolithic IC, applied to a thin-film SOI substrate, in accordance with the first embodiment of the present invention.

The manufacturing processes shown in FIGS. 2A–2B and 3A–3C are applicable not only to a general silicon substrate but also to an SOI (i.e., Silicon On Insulator) substrate. More specifically, as shown in FIG. 5A, an SOI substrate 20 is prepared. The SOI substrate 20 comprises a thin single crystal silicon layer 23 is formed via a silicon dioxide film 22 on a silicon substrate 21. The silicon dioxide film 22 has a thickness of 1 μm or less. The single crystal silicon layer 23 has a thickness of approximately 0.1 μm.

Figure 5B:
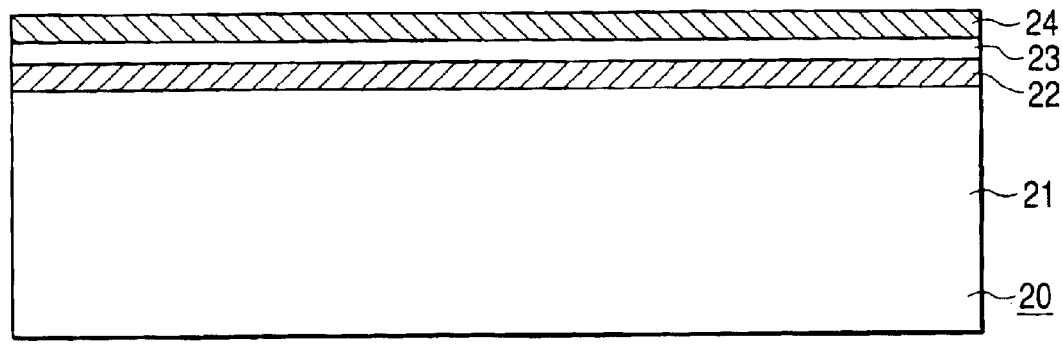
FIG. 5B is a cross-sectional view showing a manufacturing process of the monolithic IC, applied to a thin-film SOI substrate, in accordance with the first embodiment of the present invention.

Then, as shown in FIG. 5B, a mask film 24 containing a non-oxidizing material such as a silicon nitride is formed on the silicon layer 23. For example, the mask film 24 has a multilayered structure comprising a silicon dioxide film and a silicon nitride film.

Figure 5C:
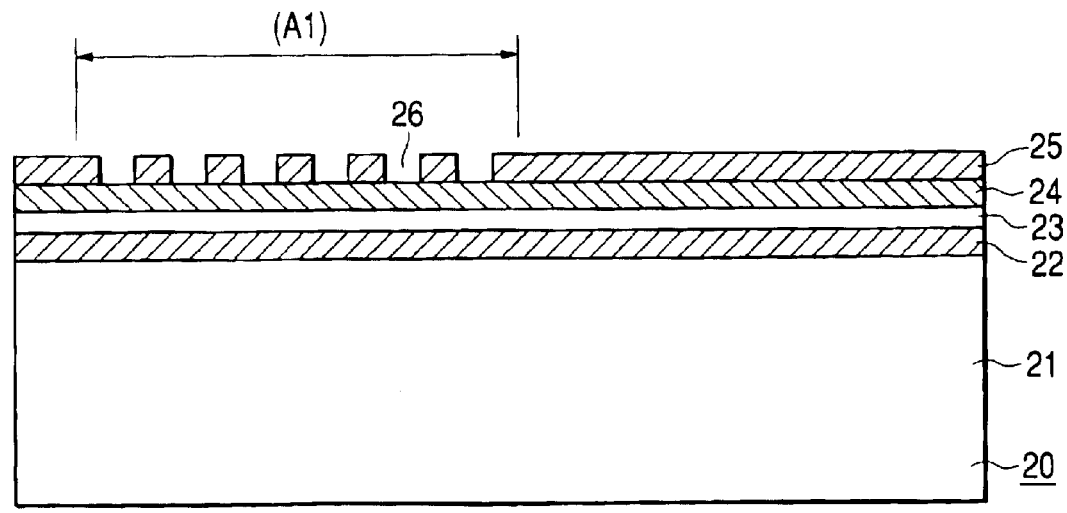
FIG. 5C is a cross-sectional view showing a manufacturing process of the monolithic IC, applied to a thin-film SOI substrate, in accordance with the first embodiment of the present invention.

Then, as shown in FIG. 5C, a photo resist 25 is coated on the mask film 24. Then, the photo resist 25 is subjected to the exposure of light having a predetermined stripe pattern 26 to leave parallel apertures in a predetermined passive element forming region (i.e., a portion where a thick thermal oxide layer is is to be formed) A1.

Figure 6A:
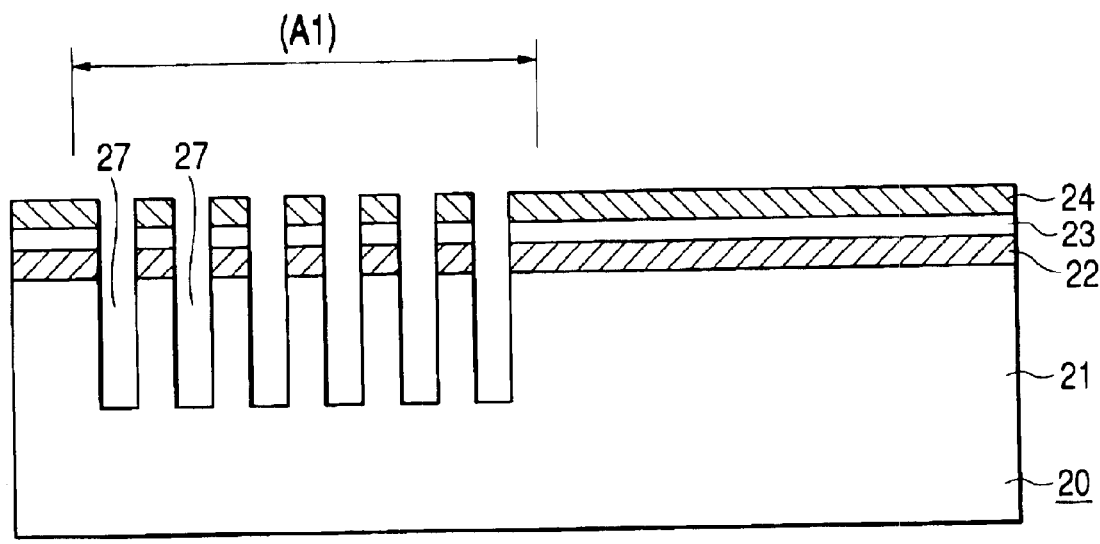
FIG. 6A is a cross-sectional view showing a manufacturing process of the monolithic IC, applied to a thin-film SOI substrate, in accordance with the first embodiment of the present invention.
Figure 6B:
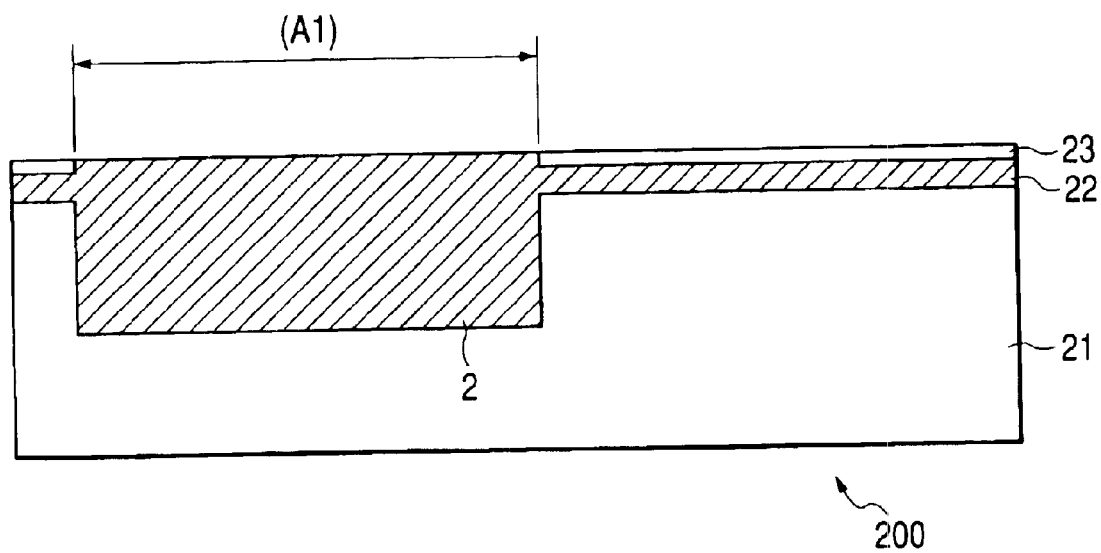
FIG. 6B is a cross-sectional view showing a manufacturing process of the monolithic IC, applied to a thin-film SOI substrate, in accordance with the first embodiment of the present invention.
Figure 7:
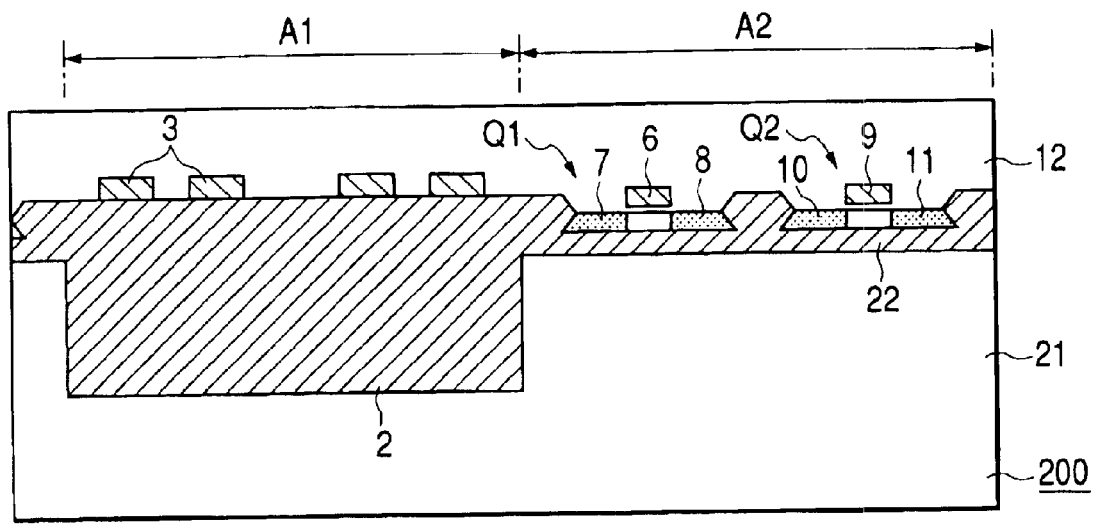
FIG. 7 is a cross-sectional view showing a manufacturing process of the monolithic IC, applied to a thin-film SOI substrate, in accordance with the first embodiment of the present invention.

Thereafter, as shown in FIG. 6A, the mask film 24 and the SOI substrate 20 are etched by using the stripe pattern 26 thus formed. The etching leaves a plurality of grooves 27 arranged in a stripe pattern. Each groove 27 has a depth of 10 μm or more and a width (W1) of 1 μm or less. A silicon material intervening between two adjacent grooves 27 has a width (W2) which is 81.8% or more with respect to the groove width (W1). Then, the substrate 20 with the mask film 24 left on the top thereof is subjected to the thermal oxidation treatment in the oxidizing atmosphere containing hydrogen at 965° C. or above, preferably at 1,100° C. or above. FIG. 6B shows the thermal oxide layer 2 formed as a result of the thermal oxidation treatment. FIG. 7 shows a monolithic IC formed by using a semiconductor substrate 200 thus formed.

In this manner, to perform the thermal oxidation treatment, the mask film 24 containing a non-oxidizing material such as a silicon nitride film is formed in the passive element forming region. The mask film 24 prevents the thin silicon layer 23 of approximately 0.1 μm (in thick) from disappearing as a result of oxidation of the passive element forming region on the SOI substrate in the thermal oxidizing process shown in FIG. 6B. This ensures that the thermal oxide layer 2 having a thickness of 10 μm or more is partly formed on the thin-film SOI substrate 20.

According to a conventional high-frequency circuit using a thin-film SOI substrate, it is relatively easy to suppress the loss of the passive elements (i.e., reduce the electric consumption) compared with a high-frequency circuit using a general silicon substrate. However, the conventional high-frequency circuit using a thin-film SOI substrate could not increase the thickness of an oxide film layer located beneath the passive element. Hence, the conventional high-frequency circuit using a thin-film SOI substrate is bothered with the loss caused by the parasitic resistance and the parasitic capacitance residing in the passive element forming region A1. In this respect, this embodiment provides an excellent monolithic IC which is capable of reducing the loss of the passive element and accordingly is operable at higher frequencies with lower loss (i.e., lower electric power consumption).

Figure 8:
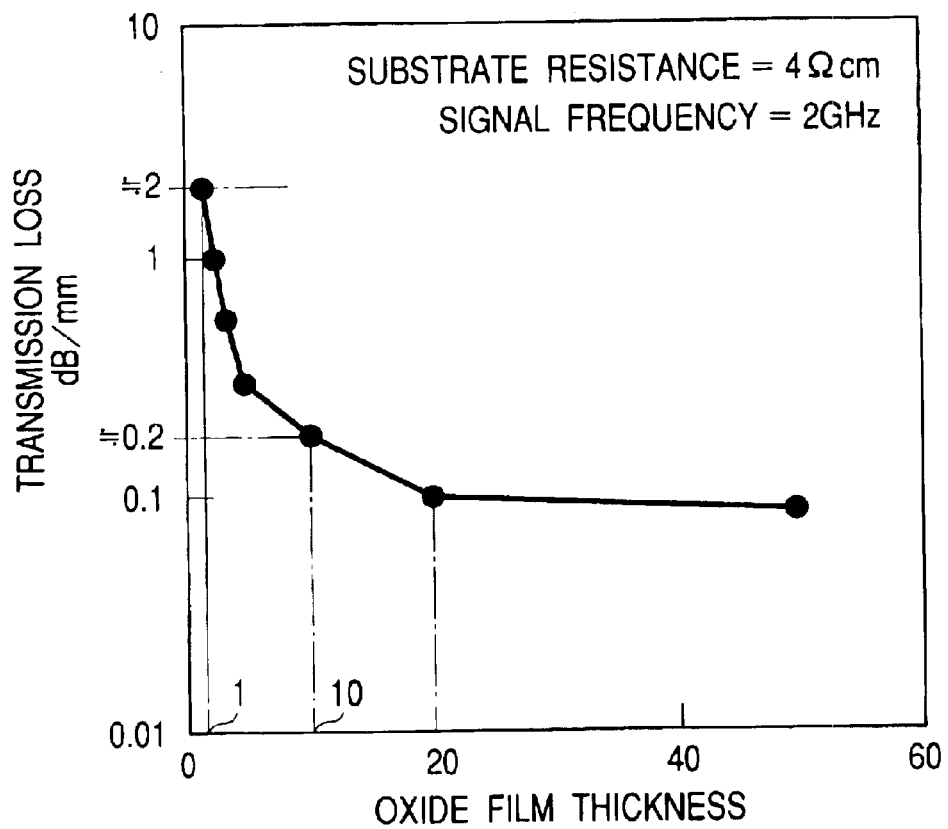
FIG. 8 is a graph showing a relationship between the signal transmission loss and the oxide film thickness obtained as a result of simulation in accordance with the second embodiment of the present invention.

FIG. 8 shows a simulation result with respect to a relationship between the signal transmission loss and the oxide film thickness when a frequency 'f' applied to the signal wiring (i.e., signal transmission path) disposed on the oxide film is 2 GHz. In this simulation, the specific resistance of the silicon substrate is 4 Ω·cm. The signal wiring is made of aluminum (Al) with a thickness of 1 μm and a width of 50 μm. A gap between the signal wiring and the ground wiring is 30 μm, and the entire length of the signal wiring is 1 mm.

As apparent from FIG. 8, the transmission loss decreases with increasing thickness of the oxide film. When the oxide film thickness is 10 μm or more, the transmission loss decreases to a ⅒ level with respect to the value at 1 μm. When the oxide film thickness exceeds 20 μm, the transmission loss is substantially stabilized. The oxide film thickness at which the transmission loss is stabilized varies depending on the frequency of a signal, the wiring resistance value, and the size of the wiring. To obtain satisfactory effect in the reduction of transmission loss by using the thick oxide film in the high frequency region exceeding 100 MHz, it is preferable that the oxide film has a thickness of 10 μm or more.

As described above, the first embodiment has the following characteristics.

(I) In the semiconductor substrate 100 shown in FIG. 1, the thermal oxide layer 2 having a thickness of 10 μm or more is formed at the predetermined portion A1 where the passive element 3 is disposed. In other words, the thick thermal oxide layer 2 is formed partly (i.e., in the element forming region) on the semiconductor substrate. Thus, it becomes possible to sufficiently reduce the parasitic capacitance and the parasitic resistance giving influence to the passive element 3. Furthermore, this embodiment employs no aerial wiring structure for the passive element 3 and thus assures a sufficient mechanical strength. Namely, forming the passive element 3 on the thermal oxide layer 2 having the thickness of 10 μm, which is partly formed on the semiconductor substrate, makes it possible to satisfactorily reduce the parasitic capacitance and the parasitic resistance of the inductor or other passive element 3 and also makes it possible to obtain a sufficient mechanical strength.

(II) As a manufacturing method of the above-described semiconductor substrate, first of all, as shown in FIG. 3B, the grooves 16 having a depth of 10 μm or more is formed at a predetermined portion A1 on the semiconductor substrate where the passive element is disposed (i.e., at the passive element forming region). Next, as shown in FIG. 3C, the thermal oxidation treatment is applied to the substrate to let the oxide film grow from the inside surface of the groove 16, thereby filling the groove 16 with the thermal oxide film thus grown. More specifically, a plurality of grooves 16 each having a depth of 10 μm or more are formed adjacent to each other at the predetermined portion A1 on the semiconductor where the passive element is disposed. Then, through the thermal oxidation treatment, the oxide film grows from the inside surface of each groove 16 until the inside space of groove 16 is completely filled with the thermal oxide film thus formed. Meanwhile, the intervening portion between two adjacent grooves 16 turns into a thermal oxide layer. As a result, the semiconductor substrate 100 is obtained.

The resultant thermal oxide layer 2 grows and fills the inside space of the groove, while giving substantially no stress on the silicon substrate during a volumetric expansion of the oxide film. Hence, the warp of silicon substrate does not arise. The thick thermal oxide layer 2 has a flat surface substantially level with the semiconductor substrate surface. The thermal oxide layer can be formed at a desired region. No special flattening process is required. Furthermore, the manufacturing method of this embodiment makes it possible to manufacture a great amount of semiconductor substrates without changing the conventional LSI manufacturing processes. This makes it possible to realize a mass production of high-performance semiconductor devices such as high-frequency monolithic ICs. In this manner, the manufacturing method of this embodiment can be preferably applied to a semiconductor device incorporating the passive elements (e.g., inductors) 3 operable at high frequencies.

(III) According to the manufacturing method of a semiconductor substrate, it is desirable that the groove 16 has a width W1 of 1 μm or less and is also preferable that the width W2 of the semiconductor material (e.g., silicon material) 17 intervening between the grooves 16 is 81.8% with respect to the groove width W1 (i.e., W2≧0.818×W1). With this arrangement, it becomes possible to completely fill the inside space of groove 16 with the thermal oxide film. Namely, in the process of executing the thermal oxidation treatment to let the oxide film grow from the groove surface, the oxide film gradually fills the inside space of groove 16 until the groove 16 is completely filled with the oxide layer. When the width W2 of the intervening silicon material 17 is set to be equal to approximately 81,8% with respect to the groove width W1, the oxidation of the intervening silicon material 17 thoroughly accomplishes substantially at the same time the inside space of groove 16 is completely filled with the oxide layer grown through the thermal oxidation treatment. Hence, it becomes possible to form the thick thermal oxide layer 2 having a thickness of 10 μm or more in a wide area encompassing all of the formed grooves 16.

If the width W2 of the intervening material 17 is set to be larger than 81,8% with respect to the groove width W1, a significant silicon region will remain unchanged. In this case, if the width of the remaining silicon material is sufficiently small compared with the thermal oxide layer formed in the groove 16, the parasitic capacitance and the parasitic resistance of an inductor or the like formed just above the remaining silicon material will be very small or negligible.

(IV) It is preferable that the thermal oxidation treatment is performed in the oxidizing atmosphere containing hydrogen at 965° C. or above, preferably at 1,100° C. or above.

(V) It is preferable that the reactive ion etching or the plasma etching is used in the step of forming the grooves 16. For example, the anisotropic etching such as the reactive ion etching using a fluorine group gas, especially the high-density plasma etching, ensures that each resultant groove 16 has a depth of 10 μm or more and a width of 1 μm or less so as to extend perpendicularly to the substrate surface.

Second Embodiment

Next, a second embodiment of the present invention will be explained chiefly based on characteristic features different from the first embodiment.

Figure 9A:
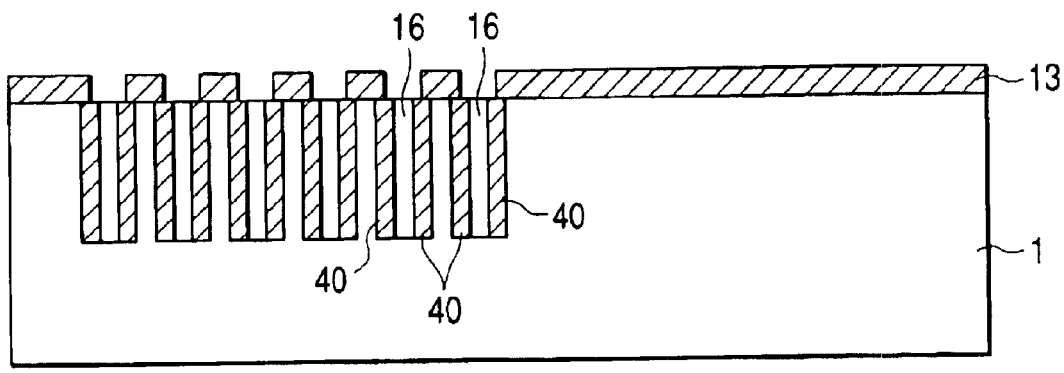
FIG. 9A is a cross-sectional view showing a manufacturing process of the monolithic IC in accordance with a second embodiment of the present invention.
Figure 9B:
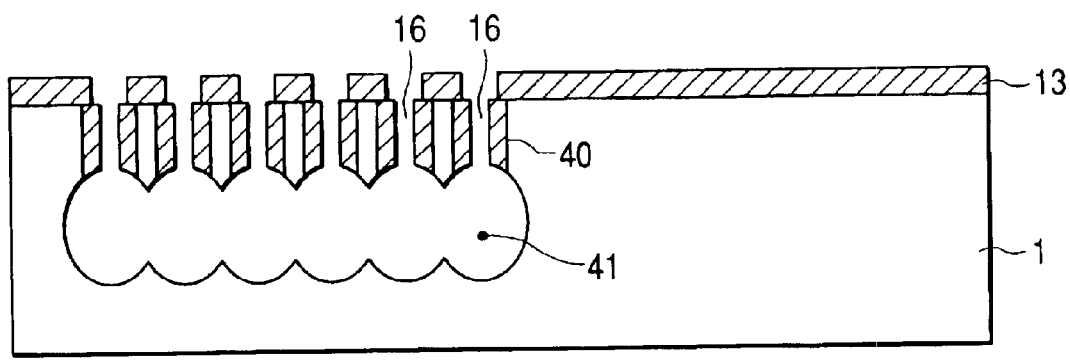
FIG. 9B is a cross-sectional view showing a manufacturing process of the monolithic IC in accordance with the second embodiment of the present invention.
Figure 9C:
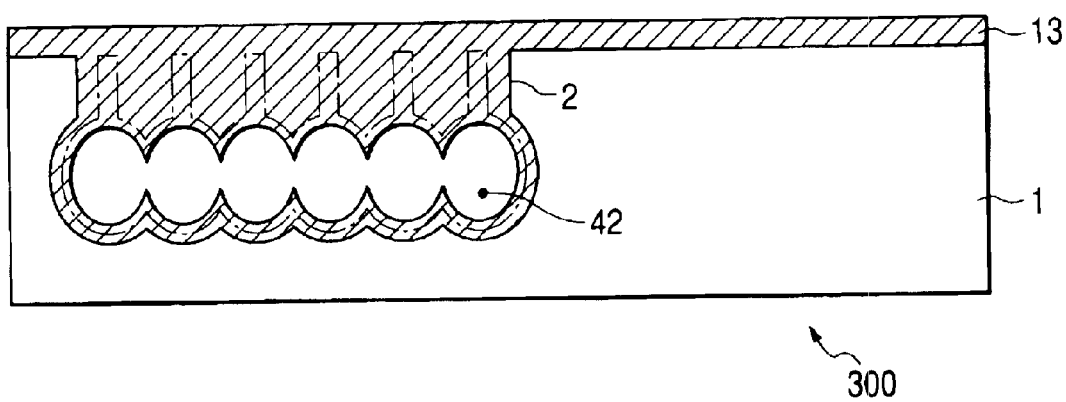
FIG. 9C is a cross-sectional view showing a manufacturing process of the monolithic IC in accordance with the second embodiment of the present invention.
Figure 10:
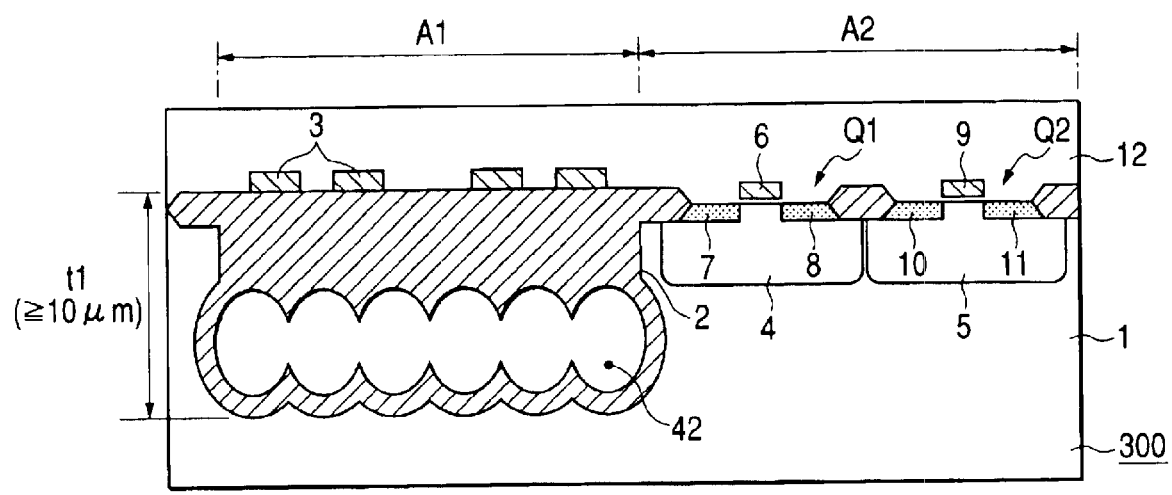
FIG. 10 is a cross-sectional view showing a manufacturing process of the monolithic IC in accordance with the second embodiment of the present invention.

FIGS. 9A–9C and 10 shows manufacturing processes of a monolithic IC in accordance with the second embodiment of the present invention. As shown in FIG. 10, a thick thermal oxide layer 2 is formed on the semiconductor substrate partly (i.e., in the element forming region). The thick thermal oxide layer 2 comprises a cavity 42 formed therein.

Hereinafter, the manufacturing processes for forming a semiconductor substrate according to the second embodiment will be explained in detail with reference to FIGS. 2A–2B, 3A–3B, 9A–9C, and 10.

First of all, as shown in FIG. 2A, an oxide film ($SiO_2$) 13 is formed on the a prepared silicon substrate 1. Then, as shown in FIG. 2B, a photo resist 14 is coated on the oxide film 13. Then, the photo resist 14 is subjected to the exposure of light having a predetermined stripe pattern to leave parallel apertures 15 each having a width W1 of 1 μm or less. A width W2 of an intervening portion between two adjacent apertures 15 is 81.8% or more with respect to the width W1 of each aperture 15 (i.e., W2≧0.818×W1).

Thereafter, as shown in FIG. 3A, the oxide film 13 is etched by using the stripe pattern thus formed with the photo resist 14. Then, the photo resist 14 is removed off to leave the oxide film 13 having been thus patterned as a mask. At this moment, the portions of silicon substrate 1 to be etched are just exposed.

Next, as shown in FIG. 3B, an anisotropic etching is applied to the silicon substrate 1 to form a plurality of grooves 16 arranged in the stripe pattern defined by the mask of oxide film 13. According to this embodiment, each groove 16 has a depth L1 of 5 μm or more. To this end, it is preferable that the anisotropic etching is the reactive ion etching using a fluorine group gas, especially high-density plasma etching. This ensures that the resultant groove 16 has a sufficient depth so as to extend perpendicularly to the substrate surface (i.e., the upper surface of silicon substrate 1). A silicon material 17 intervening between two adjacent grooves 16 has a width W2 which is 81.8% or more with respect to the groove width W1. The height L1 of the silicon material 17 is 5 μm or more. Thus, each silicon material 17 looks like a thin plate.

Next, as shown in FIG. 9A, the oxygen plasma processing or the like is applied to the groove 16 so that a thin oxide film 40 is formed on an inside surface (i.e., both a side surface and a bottom surface) of the groove 16. Then, the anisotropic etching is applied only to the oxide film 40 formed on the bottom surface of the groove 16 to expose the silicon substrate 1 at a trench bottom (i.e., a portion corresponding to the bottom of the groove).

Then, as shown in FIG. 9B, the reactive ion etching having enhanced isotropic etching properties is applied to the bottom of each groove 16 to form the cavity 41 extending not only in the vertical direction but also in the lateral direction. In this case, the etching depth is set to approximately 5 μm from the bottom level of each groove 16. As a result, the cavity 41 is formed as a laterally extending space tying the plurality of grooves 16 in a row at the region beneath the bottoms of respective grooves 16.

Next, as shown in FIG. 9C, the substrate 1 is subjected to an oxidation treatment at 965° C. or above in an oxidizing atmosphere containing hydrogen, such as wet $O_2$, steam $O_2$, or a combustion mixture of $H_2$ and $O_2$. The oxidation advances in such a manner that the growing oxide film gradually fills the inside space of each groove 16 until the outermost surfaces of the oxide films growing from opposed walls of the groove 16 merge with each other. In this manner, as a result of the oxidation treatment, the inside space of the groove 16 is completely filled with the oxide layer (i.e., silicon dioxide) 2.

Meanwhile, the oxidation advances from the inner wall surface of the cavity 41 and leaves a closed cavity 42 shrunken from the cavity 41. When the width W2 of the thin platelike silicon material 17 intervening between two adjacent grooves 16 is set to be equal to approximately 81.8% with respect to the groove width W1, the thin platelike silicon material 17 is thoroughly oxidized (i.e., turns into a silicon dioxide) at the moment the inside space of each groove 16 is entirely filled with the oxide film. In this manner, the thick thermal oxide layer 2 having a thickness of 10 μm or more can be formed in a wide area encompassing all of the grooves 16 arranged in a stripe pattern.

In the second embodiment, like the first embodiment, the oxidization treatment is performed at 965° C. or above. Setting the oxidization treatment temperature to this level assures the formation of the oxide film on the silicon substrate 1 with a relatively lower stress given to the silicon substrate 1 due to the effect of viscous flow of the oxide film during the oxidation treatment. The oxide layer 2 grows and fills the inside space of the groove 16, while giving substantially no stress on the silicon substrate 1 during a volumetric expansion of the oxide film. Hence, the warp of silicon substrate 1 does not arise even when the thick oxide layer 2 accommodating the cavity 42 is formed in the substrate 1.

According to the second embodiment, like the first embodiment, it is preferable to remove the oxide film (i.e., mask) 13 formed in the process shown in FIG. 2A or the oxide film 40 formed in the process shown in FIG. 9A by etching prior to the oxidation treatment shown in FIG. 9C.

Furthermore, like the first embodiment, it is possible to add a process of correcting the groove shape prior to the oxidation treatment shown in FIG. 9C. For example, the correcting process includes a step of forming an oxide film of approximately 0.1 μm on the groove surface and a step of removing the thus firmed oxide film by etching to smoothen the groove surface.

Furthermore, like the first embodiment, it is also preferable to perform the process of forming the grooves 16 in such a manner that the groove width W1 is gradually widened as its altitudinal position approaches the substrate surface (i.e., the upper surface of silicon substrate 1). Furthermore, when the temperature of the oxidation treatment shown in FIG. 9C is increased to 1,100° C. or above, it becomes more easy for the oxide film to smoothly and completely fill the groove 16 due to enhanced viscous flow of the oxide film.

The surface of the thick thermal oxide layer 2 thus formed is flat. The thermal oxide layer having the thickness of 10 μm or more has a sufficient strength, although it accommodates the closed cavity 42 therein. Accordingly, the ordinary LSI processes can be applied to the thus fabricated semiconductor substrate 300 so as to form or provide the active elements Q1, Q2 (i.e., MOS transistors) on the silicon substrate 1 and the passive element 3 (i.e., spiral inductor) on the thermal oxide layer 2, thereby constituting the monolithic IC shown in FIG. 10.

Moreover, like the first embodiment, the second embodiment is applicable to a thin-film SOI substrate.

As described above, the second embodiment has the following characteristics.

(I) The closed cavity 42 is formed inside the thermal oxide layer 2 as shown in FIG. 10. The cavity 42 has a relative dielectric constant of approximately 1 which is fairly smaller than 3.9 of the silicon dioxide. It becomes possible to reduce the parasitic capacitance compared with the one having no cavity. As a result, it becomes possible to obtain the enhanced effect of reducing transmission loss with a relatively thin thermal oxide layer.

(II) As a manufacturing method of the above-described semiconductor substrate, first of all, as shown in FIG. 9A, the laterally extending bore is formed for connecting adjacent grooves 16 at a bottom region thereof so as to leave the cavity 41 tying the plurality of grooves 16 in a row as shown in FIG. 9B, after accomplishing the step of forming the plurality of grooves 16 arranged adjacent to each other as shown in FIG. 9A. Thereafter, the thermal oxidation treatment is performed to let the oxide film grow from an inside surface of the cavity 41 as well as from the inside space of the groove 16 so as to fill the inside space of the groove 16 with the thermal oxide film thus grown and finally leave a closed cavity 42 shrunken from the cavity 41. Especially, it is preferable that the manufacturing method of the above-described semiconductor substrate comprises a step of forming the laterally extending bore for connecting adjacent grooves 16 at a bottom region thereof so as to leave a cavity 41 tying the plurality of grooves 16 in a row, after accomplishing the step of forming the plurality of grooves 16 arranged adjacent to each other. And, the thermal oxidation treatment is performed to let the oxide film grow from an inside surface of the cavity 41 as well as from the inside space of the groove 16 so as to fill the inside space of the groove 16 with the thermal oxide film thus grown and turn an entire portion intervening between adjacent grooves 16 into a thermal oxide layer, and finally leave the closed cavity 42 shrunken from the cavity 41.

Third Embodiment

Hereinafter, a third embodiment of the present invention will be explained chiefly based on characteristic features different from the first embodiment.

Figure 11:
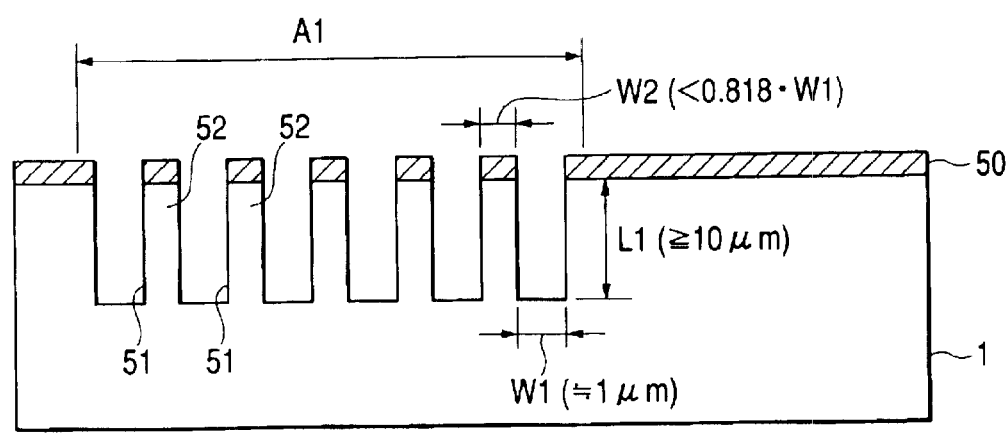
FIG. 11 is a cross-sectional view showing a manufacturing process of the monolithic IC in accordance with a third embodiment of the present invention.

The manufacturing processes of a monolithic IC in accordance with the third embodiment of the present invention will be explained with reference to FIGS. 11 to 14. First of all, as shown in FIG. 11, an oxide film (SiO$_2$) 50 is formed (i.e., patterned) on a prepared silicon substrate 1. Then, an anisotropic etching is applied to the silicon substrate 1 with the oxide film 50 serving as a mask, thereby leaving a plurality of grooves 51 at a predetermined portion A1 on an upper surface of substrate 1 where the passive element is formed. Each groove 51 has a depth L1 of 10 μm or more and a width W1 of approximately 1 μm. A silicon material 52 intervening between two grooves 51 has a width W2 which is smaller than 81.8% with respect to the with W1 of groove 51 (W2<0.818×W1). Each silicon material 52, having a height of 10 μm or more, looks like a thin plate.

Figure 12:
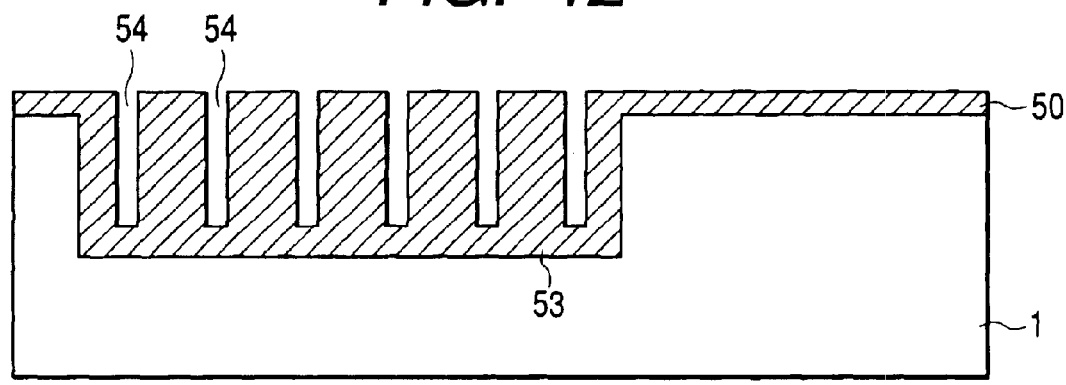
FIG. 12 is a cross-sectional view showing a manufacturing process of the monolithic IC in accordance with the third embodiment of the present invention.

Then, as shown in FIG. 12, the thermal oxidation treatment is applied on the upper surface of silicon substrate 1 to let an oxide film 53 grow from the inside surface of each groove 51 until the inside space of groove 51 is incompletely filled with the thermal oxide film thus formed. Meanwhile, the intervening portion (i.e., silicon material 52) between two adjacent grooves 51 entirely turns into a thermal oxide layer 53. As a result, a plurality of shrunken grooves 54, each having a width smaller than the original groove width W1, remain on the upper surface of silicon substrate 1.

More specifically, in the process of this oxidation treatment, the oxidation advances in each silicon material 52 intervening two adjacent grooves 51 while the oxide film grows from the inside surface of the groove 51. The silicon material 52 turns into a silicon dioxide at the rate of 45% with respect to the overall thickness of the oxide film. Meanwhile, the oxide film growing in the groove 51 has a thickness equivalent to 55% with respect to the overall oxide film thickness. Accordingly, the oxidation advances in such a manner that the growing oxide film 53 gradually fills the inside space of groove 51 so that the groove width reduces monotonously until the thin platelike silicon material 52 completely turns into the silicon dioxide. The thermal oxidation treatment is stopped at the moment the thin platelike silicon material 52 has completely turned into the silicon dioxide. Thus, the growth of oxide film 53 stops before the outermost surfaces of the oxide films growing from opposed walls of the groove 51 merge with each other, thereby leaving the thin groove 54 shrunken from the original grooves 51.

Figure 13:
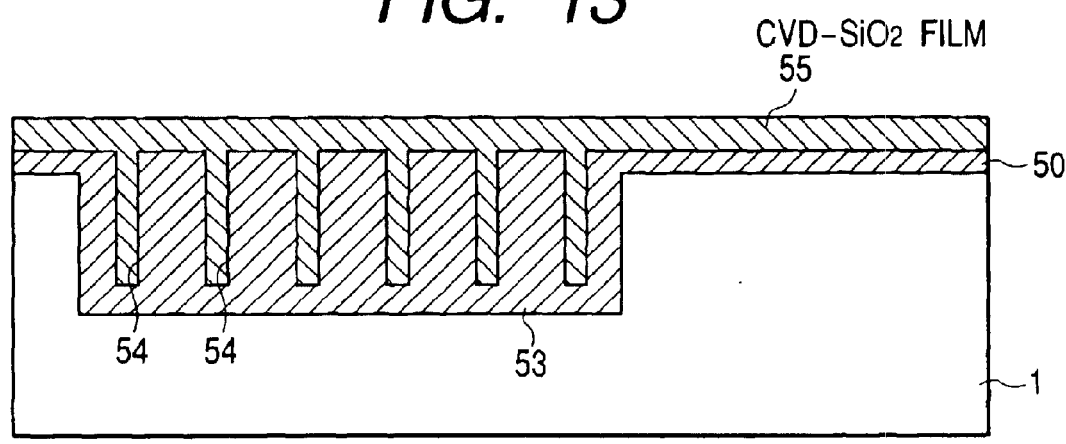
FIG. 13 is a cross-sectional view showing a manufacturing process of the monolithic IC in accordance with the third embodiment of the present invention.

Then, as shown in FIG. 13, the thin groove 54 are completely filled with an insulating material 55. More specifically, a silicon dioxide film 55 having a thickness of approximately 300 nm is accumulated on the silicon substrate 1 by using the CVD method so that the thin groove 54 incompletely 1 shrunken from the groove 51 is completely filled with the silicon dioxide film 55.

Figure 14:
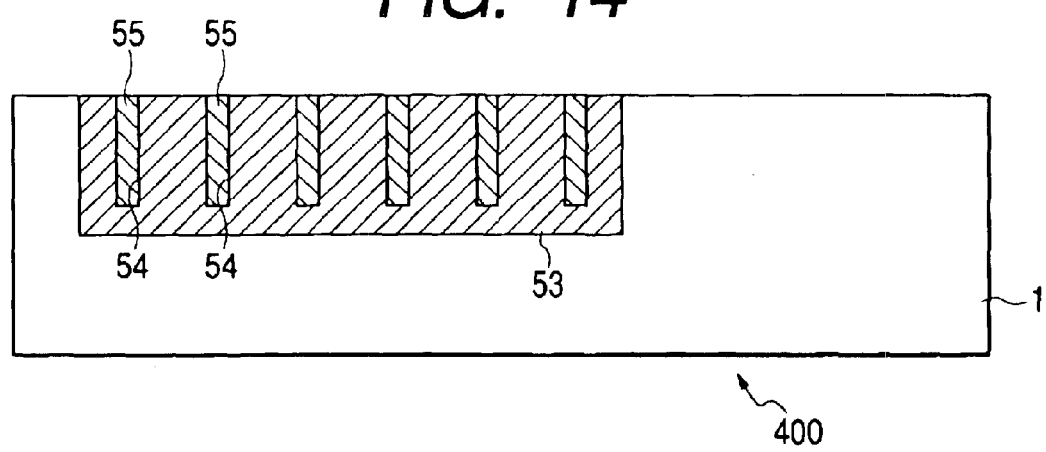
FIG. 14 is a cross-sectional view showing a manufacturing process of the monolithic IC in accordance with the third embodiment of the present invention.

Next, the reactive ion etching or the like is applied to the silicon dioxide films 50 and 55 formed on the upper surface of silicon substrate 1 to remove the silicon dioxide films 50 and 55. As a result, as shown in FIG. 14, a fresh substrate surface is exposed on the silicon substrate 1 except for the passive element forming region A1. In this manner, the excessive silicon dioxide film is completely removed off the substrate 1 and the thick insulating layer having the thickness of 10 μm or more is left in the passive element forming region A1.

The oxidation process shown in FIG. 12 is a process for forming an oxide film of 1 μm or less which is simultaneously performed together with the LOCOS (i.e., localized oxidation of silicon) process or other element separating oxide film forming process preferably employed in an ordinary LSI manufacturing technique. Namely, the thermal oxidation treatment is performed simultaneously with the thermal oxidation treatment for forming an element separating oxide film on the upper surface of the silicon substrate 1. In this case, to prevent the portion where the transistors or other active elements are formed from being oxidized, a thin oxide film and a silicon nitride film are formed and the patterning of the active element forming region is accomplished before forming the groove forming mask material 50 is formed on the upper surface of silicon substrate 1. The patterning of the active element forming region is performed in such a manner that both of the thin oxide film and the silicon nitride film are removed off the upper surface of the silicon substrate except for the passive element forming region. In this case, as the oxidation processing of grooves 51 and the element separating process can be commonly performed, it becomes possible to minimize the addition of necessary manufacturing processes of this embodiment to be added to the ordinary LSI processes.

When the temperature of the oxidation treatment shown in FIG. 12 is increased to 1,100° C. or above, it becomes more easy for the silicon dioxide film to grow with a uniform thickness from the inside surface of the groove 51 and prevent undesirable cavity from residing in the grown oxide film.

Manufacturing a semiconductor substrate 400 by using the above-described processes makes it possible to entirely turn the silicon material intervening between two adjacent grooves 51 into the silicon dioxide layer during the oxidizing process of letting the oxide film of 1 μm or less grow as known in the ordinary silicon LSI manufacturing technique. Meanwhile, the groove width gradually reduced to a predetermined level equivalent to several hundreds or less. Thereafter, the remaining thin grooves can be filled with an insulating film used in the CVD method employed in the ordinary silicon LSI manufacturing technique.

Figure 15:
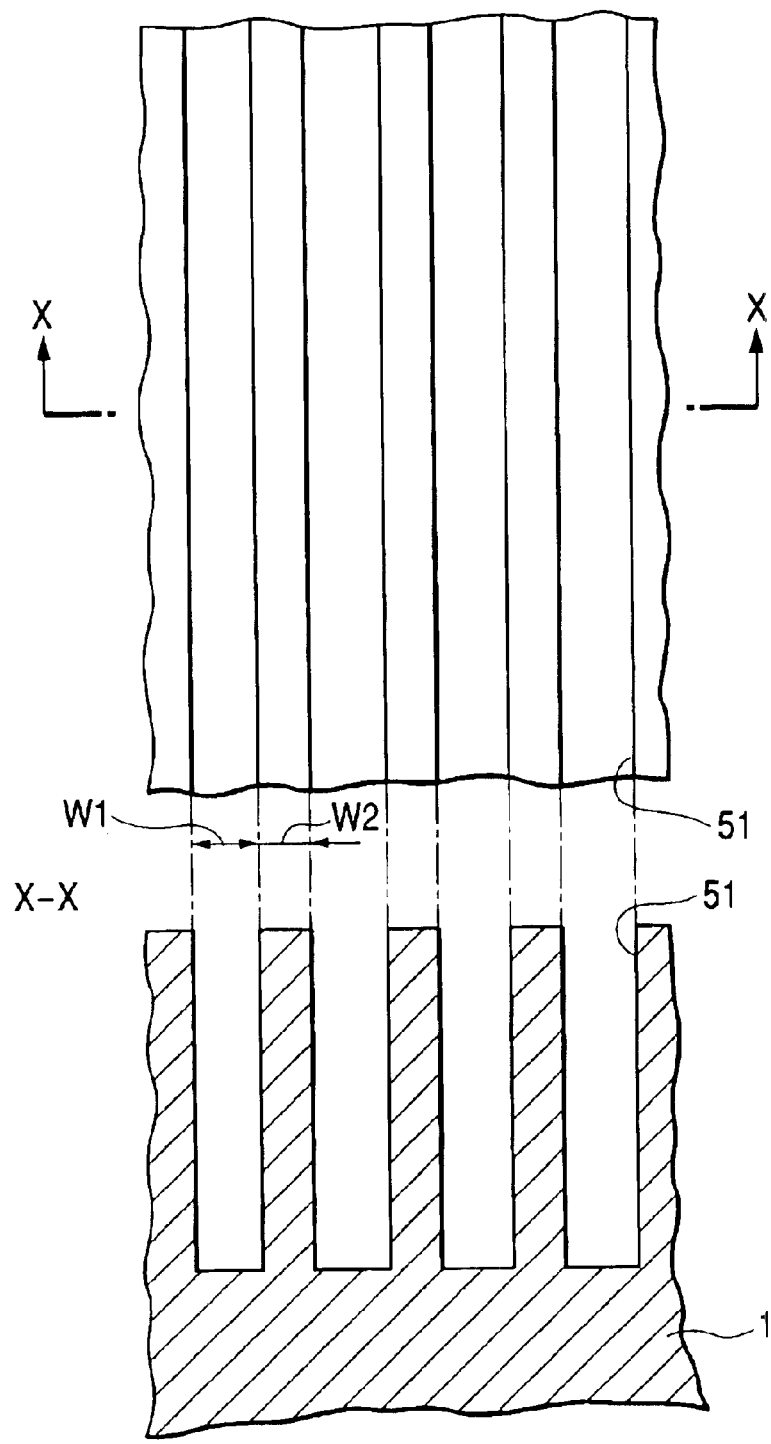
FIG. 15 is a plan and cross-sectional view explaining a manufacturing process of the monolithic IC in accordance with the third embodiment of the present invention.
Figure 16:
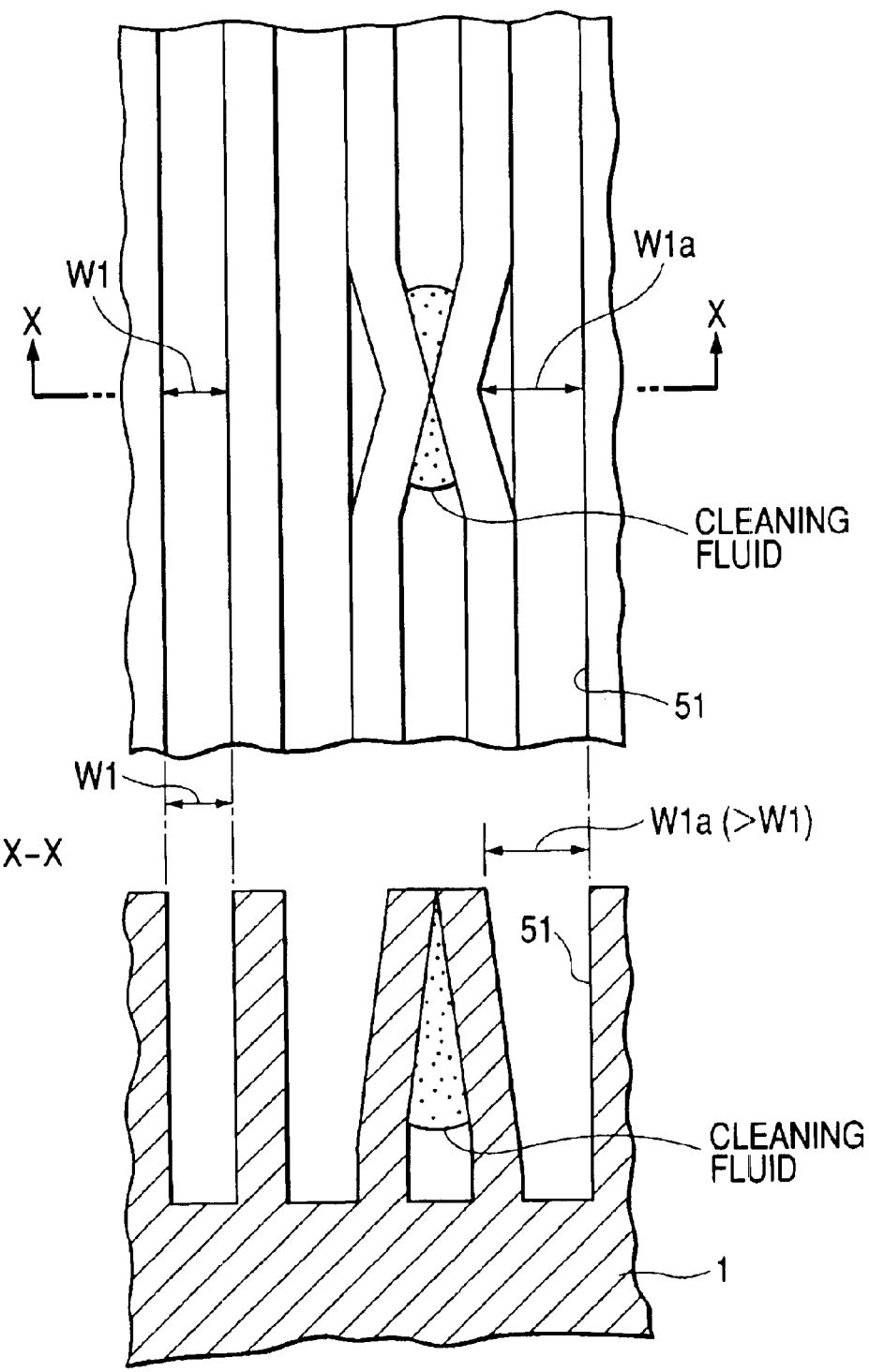
FIG. 16 is a plan and cross-sectional view explaining a manufacturing process of the monolithic IC in accordance with the third embodiment of the present invention.

In the case where a water cleaning process or any other process of soaking the grooves 51 into a liquid, there will be the possibility that the thin platelike silicon materials intervening between two adjacent grooves may brought into contact with each other due to a surface tension of the cleaning fluid. More specifically, as shown in FIG. 15, the plurality of parallel grooves 51 are formed on the silicon substrate 1. When the grooves 51 are subjected to the water cleaning or any other liquid soaking process, the thin platelike silicon materials intervening between adjacent grooves 51 may lean to each other due to a surface tension of the cleaning fluid as shown in FIG. 16. The deformed shape of the thin platelike silicon materials intervening between two adjacent grooves 51 remains even after the silicon substrate 1 is dried. Thus, the groove width is undesirably widened locally (i.e., W1a>W1 as indicated in FIG. 16). As a result, it is required to accumulate a thick CVD-silicon dioxide film to fill the widened groove portion.

Figure 17:
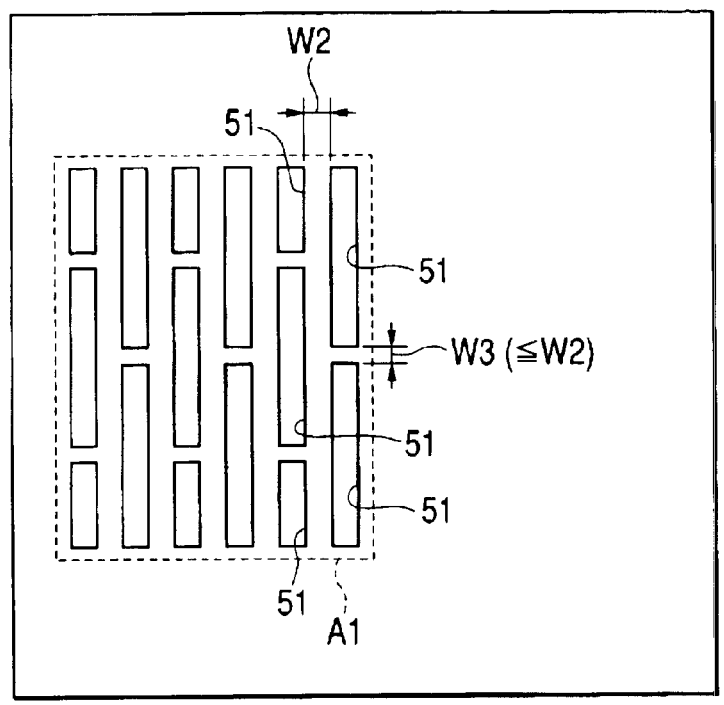
FIG. 17 is a plan view explaining a manufacturing process of the monolithic IC in accordance with the third embodiment of the present invention.

Considering this drawback, it is preferable that each groove 51 is dissected into a plurality of short groove sections arrayed in line as shown in FIG. 17. In this case, a gap W3 of the silicon material between two adjacent groove sections is not longer than the width W2 of the silicon material intervening between two adjacent grooves 51 (i.e., W3≦W2).

Figure 18:
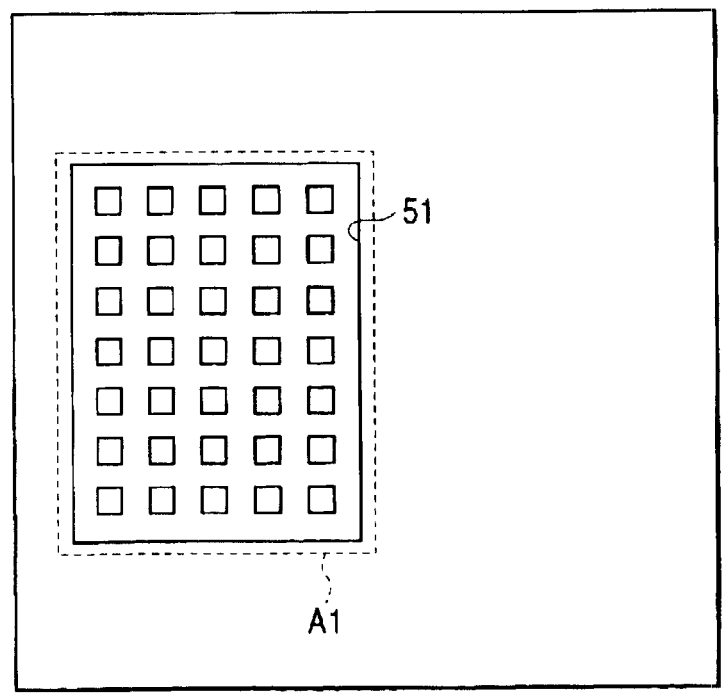
FIG. 18 is a plan view explaining a manufacturing process of the monolithic IC in accordance with the third embodiment of the present invention.
Figure 19:
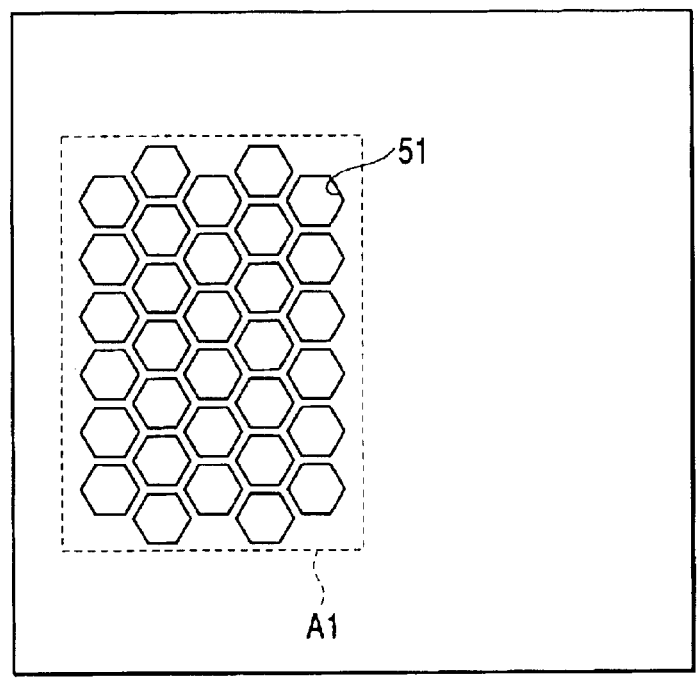
FIG. 19 is a plan view explaining a manufacturing process of the monolithic IC in accordance with the third embodiment of the present invention.

Alternatively, as shown in FIG. 18, it is preferable that the grooves 51 are configured into a grid or lattice pattern. Furthermore, as shown in FIG. 19, it is preferable that grooves 51 are configured into a honeycomb pattern. In any case, the silicon material intervening between two adjacent grooves 51 has a constant width.

Furthermore, in the arrangement shown in FIG. 11, it is preferable that the width W2 of silicon material 52 intervening between two adjacent grooves 51 is approximately 81,8% with respect to the width W1 of the groove 51. In this case (W2=0.818×W1), the inside space of groove 51 is substantially filled with the silicon dioxide film when the silicon substrate 1 is subjected to the thermal oxidation treatment. Only a tiny clearance of several hundreds nm will remain at the uppermost end of the groove 51. Such a tiny clearance can be easily filled with a film formed in the succeeding process.

The oxidation treatment of this step (i.e., the treatment of FIG. 12) is applied to the silicon substrate 1 with the oxide film (i.e., mask material) 50. However, it is possible to remove the oxide film 50 by etching prior to the oxidation treatment of FIG. 12.

Depending on the etching conditions, the step of forming the grooves 51 shown in FIG. 11 may leave a dull angled at the uppermost end (i.e., the corner edge) of the groove 51. Or, the groove width at the uppermost end of the groove 51 may become narrow compared with the groove widths at other portions. This will result in that only the uppermost end portion is filled with the oxide layer through the process of FIG. 12 or FIG. 13 and a unwanted cavity remains inside the substrate 1. If the cavity does not give serious influence to the later-performed LSI processes, the cavity can be left in this condition. However, there is the possibility that any chemicals dissolved water may remain in this cavity. This will become a contamination source. Or, expansion of the cavity during the heat treatment may lead to fatal damage of the substrate 1. To avoid these problems, it is preferable to add a process of correcting the groove shape prior to the oxidation treatment shown in FIG. 12. For example, the correcting process includes a step of forming an oxide film of approximately 0.1 μm on the groove surface and a step of removing the thus formed oxide film by etching to smoothen the groove surface. Adding this correcting process surely widens the groove width at the uppermost end of the groove 51. It is also preferable to use the dry etching or any other method to correct the shape of the groove.

Moreover, like the first embodiment, the third embodiment is applicable to a thin-film SOI substrate. Furthermore, the reactive ion etching or the plasma etching can be applied to the process of forming the grooves 51. It is also preferable that the oxidation treatment is performed in an oxidizing atmosphere containing hydrogen, such as wet $O_2$, steam $O_2$, or a combustion mixture of $H_2$ and $O_2$ at 965° C. (especially 1,100° C.) or above.

Fourth Embodiment

Hereinafter, a fourth embodiment of the present invention will be explained chiefly based on characteristic features different from the first and second embodiments.

The manufacturing processes of a monolithic IC in accordance with the fourth embodiment of the present invention will be explained with reference to FIGS. 20 to 22. The fourth embodiment is characterized in that a cavity is formed at the bottom region of the grooves as explained in the second embodiment and is also characterized in that each groove is incompletely filled with the thermal oxide film as explained in the third embodiment.

Figure 20:
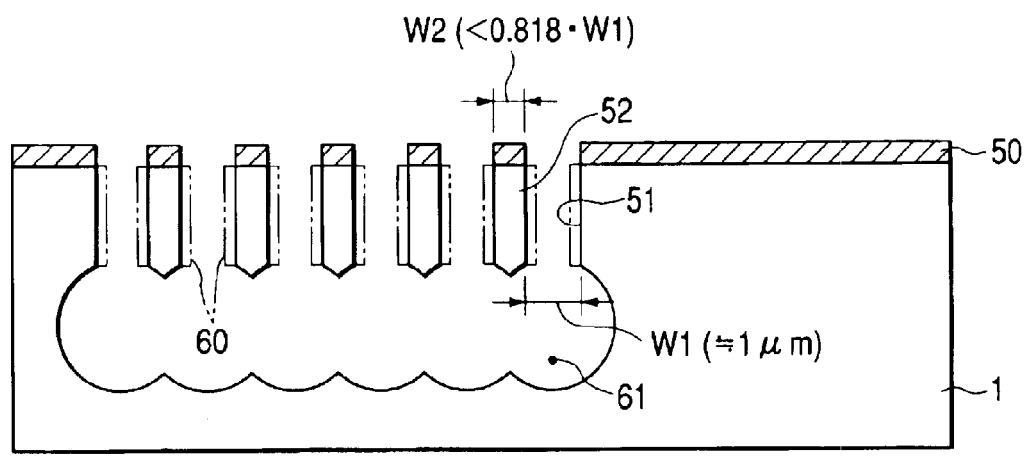
FIG. 20 is a cross-sectional view explaining a manufacturing process of the monolithic IC in accordance with a fourth embodiment of the present invention.

First of all, as shown in FIG. 20, an anisotropic etching is applied to a silicon substrate 1 with a pattered oxide film 50 provided thereon to form a plurality of grooves 51 arranged adjacent to each other on the silicon substrate 1. The width W2 of a silicon material 52 intervening between two adjacent grooves 51 is smaller than 81.8% of the width W1 of the groove 51 (i.e., W2<0.818×W1). The width W1 of each groove 51 is approximately 1 μm and the depth L1 of each groove 51 is 5 μm or more.

Thereafter, the oxygen plasma processing or the like is applied to the groove 51 so that a thin oxide film 60 is formed on an inside surface (i.e., both a side surface and a bottom surface) of the groove 51. Then, an anisotropic etching is applied only to the oxide film 60 formed on the bottom surface of the groove 51 to expose the silicon substrate 1 at a trench bottom (i.e., a portion corresponding to the bottom of the groove). Then, the reactive ion etching having enhanced isotropic etching properties is applied to the bottom of each groove 51 to form a cavity 61 extending not only in the vertical direction but also in the lateral direction. In this case, the etching depth is set to approximately 5 μm from the bottom level of each groove 51. As a result, the cavity 61 is formed as a laterally extending space tying the plurality of grooves 51 in a row at the region beneath the bottoms of respective grooves 51.

Figure 21:
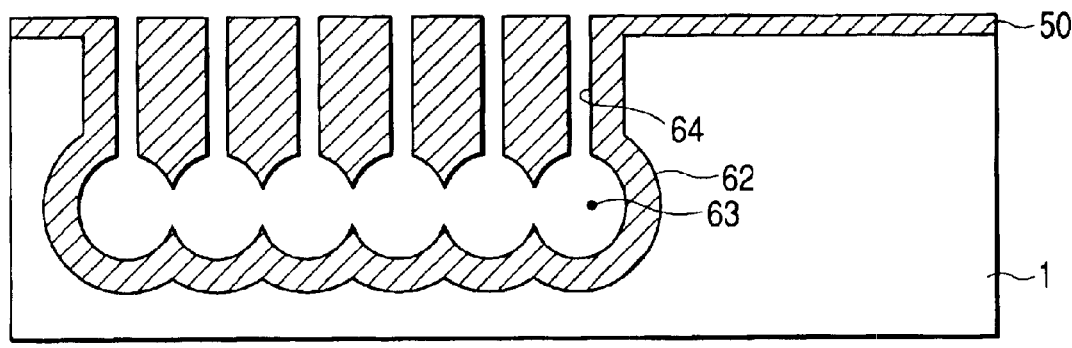
FIG. 21 is a cross-sectional view explaining a manufacturing process of the monolithic IC in accordance with the fourth embodiment of the present invention.

Next, as shown in FIG. 21, the silicon substrate 1 is subjected to an oxidation treatment at 965° C. or above in an oxidizing atmosphere containing hydrogen, such as wet $O_2$, steam $O_2$, or a combustion mixture of $H_2$ and $O_2$. The oxidation advances in such a manner that a growing oxide film 62 gradually fills the inside space of groove 51 so that the groove width reduces monotonously until the thin platelike silicon material 52 completely turns into the silicon dioxide. The thermal oxidation treatment is stopped at the moment the thin platelike silicon material 52 has completely turned into the silicon dioxide. Thus, the growth of oxide film 62 stops before the outermost surfaces of the oxide films growing from opposed walls of the groove 51 merge with each other, thereby leaving a thin groove 64 shrunken from the original grooves 51.

Meanwhile, the oxidation advances from the inner wall surface of the cavity 61 and leaves a smaller cavity 63 shrunken from the cavity 41.

In this manner, the thermal oxidation treatment is applied to the grooves 51 and the cavity 61 to let the oxide film grow from the inside surface thereof until the silicon material intervening between two adjacent grooves 51 completely turns into a silicon dioxide, while the inside space of each groove 51 is incompletely filled with the grown oxide film. And, the smaller cavity 63 shrunken from the original cavity 41 is left in the silicon substrate 1. In this case, as explained in the third embodiment, it is preferable that the thermal oxidation treatment is performed simultaneously with a thermal oxidation for forming an element separating oxide film on the upper surface of the silicon substrate 1.

Figure 22:
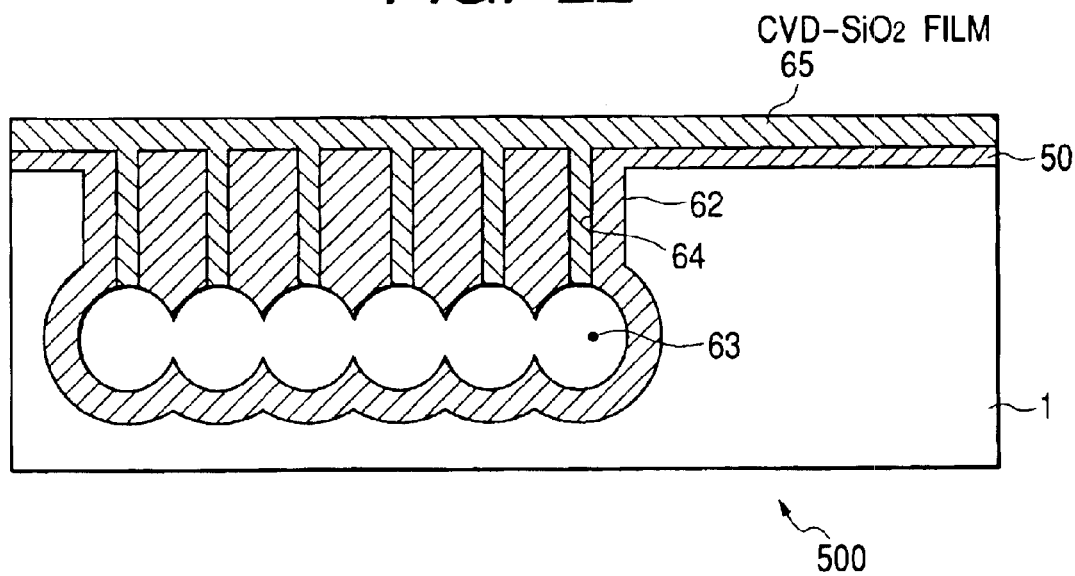
FIG. 22 is a cross-sectional view explaining a manufacturing process of the monolithic IC in accordance with the fourth embodiment of the present invention.

Subsequently, as shown in FIG. 22, a silicon dioxide film 65 having a thickness of approximately 300 nm is accumulated on the silicon substrate 1 by using the CVD method so that the thin groove 64 incompletely shrunken from the groove 51 is completely filled with the silicon dioxide film 65. The silicon dioxide film 65 filled in the thin groove 64 serves as a plug for leaving the closed cavity 63 in the silicon substrate 1 which shrunken from the original cavity 61 formed at the step of FIG. 20.

In this case, it is preferable that the width W2 of the silicon material 52 intervening between two adjacent grooves 51 shown in FIG. 20 is set to be 81.8% with respect to the width W1 of the groove 51. In this case (W2=0.818×W1), the inside space of groove 51 is substantially filled with the silicon dioxide film 62 when the silicon substrate 1 is subjected to the thermal oxidation treatment. Only a tiny clearance of several hundreds nm will remain at the uppermost end of the groove 51. Such a tiny clearance can be easily filled with a film formed in the succeeding process.

Through the above-described manufacturing processes, a semiconductor substrate 500 is obtained. Like the first embodiment, the fourth embodiment is applicable to a thin-film SOI substrate. Furthermore, the reactive ion etching or the plasma etching can be applied to the process of forming the grooves 51. It is also preferable that the oxidation treatment is performed in an oxidizing atmosphere containing hydrogen, such as wet $O_2$, steam $O_2$, or a combustion mixture of $H_2$ and $O_2$ at 965° C. (especially 1,100° C.) or above.

Although the above embodiments disclose the transistors serving as the active elements and the inductor serving as the passive element, it is possible to use a diode as the active element and a metallic wiring, a resistor, and a capacitor as the passive elements.

As apparent from the foregoing description, the present invention provides a semiconductor substrate comprising a passive element (3) disposed on an insulating member, an active element (Q1, Q2) formed in a surficial region of the insulating member, and a thermal oxide layer (2) formed at a predetermined portion (A1) corresponding to the passive element, the thermal oxide layer (2) having a thickness of 10 $\mu$m or more. Preferably, the semiconductor substrate is an SOI (Silicon On Insulator) substrate. The passive element (3) is operative at high frequencies. A cavity (42) is formed inside the thermal oxide layer (2).

The present invention provides a first manufacturing method for the above-described semiconductor substrate, comprising a step of forming a groove (16) having a depth of 10 $\mu$m or more at a predetermined portion (A1) of the semiconductor substrate (1) where the passive element (3) is formed, and a step of performing a thermal oxidation treatment to let an oxide film grow from an inside surface of the groove (16) so as to fill an inside space of the groove (16) with a thermal oxide film thus grown.

The present invention provides a second manufacturing method for the above-described semiconductor substrate, comprising a step of forming a plurality of grooves (16) each having a depth of 10 $\mu$m or more and arranged adjacent to each other at a predetermined portion (A1) of the semiconductor substrate (1) where the passive element (3) is formed, and a step of performing a thermal oxidation treatment to let an oxide film grow from an inside surface of the groove (16) so as to fill an inside space of the groove (16) with a thermal oxide film thus grown and turn an entire portion intervening between adjacent grooves (16) into a thermal oxide layer.

In the first or second manufacturing method, it is preferable that each groove (16) has a groove width (W1) of 1 $\mu$m or less, and a width (W2) of a semiconductor material (17) intervening between two adjacent grooves (16) is 81.8% or more with respect to the groove width (W1).

It is also preferable that the first or second manufacturing method further comprises a step of forming a laterally extending bore for connecting adjacent grooves (16) at a bottom region thereof so as to leave a cavity (41) tying the plurality of grooves (16) in a row, after accomplishing the step of forming the plurality of grooves (16) arranged adjacent to each other, wherein the thermal oxidation treatment is performed to let the oxide film grow from an inside surface of the cavity (41) as well as from the inside space of the groove (16) so as to fill the inside space of the groove (16) with the thermal oxide film thus grown and leave a closed cavity (42) shrunken from the cavity (41).

It is also preferable that the first or second manufacturing method further comprises a step of forming a laterally extending bore for connecting adjacent grooves (16) at a bottom region thereof so as to leave a cavity (41) tying the plurality of grooves (16) in a row, after accomplishing the step of forming the plurality of grooves (16) arranged adjacent to each other, wherein the thermal oxidation treatment is performed to let the oxide film grow from an inside surface of the cavity (41) as well as from the inside space of the groove (16) so as to fill the inside space of the groove (16) with the thermal oxide film thus grown and turn an entire portion intervening between adjacent grooves (16) into a thermal oxide layer, and finally leave a closed cavity (42) shrunken from the cavity (41).

The present invention provides a third manufacturing method for the above-described semiconductor substrate, comprising a step of forming a plurality of grooves (51) each having a depth of 10 $\mu$m or more and arranged adjacent to each other at a predetermined portion (A1) of the semiconductor substrate (1) where the passive element (3) is formed, a step of performing a thermal oxidation treatment to let an oxide film grow from an inside surface of the groove (51) so as to incompletely fill an inside space of the groove (51) with a thermal oxide film thus grown and turn an entire portion intervening between adjacent grooves (51) into a thermal oxide layer, and a step of filling a narrowed groove (54) incompletely shrunken from the groove (51) with an insulating material (55).

Preferably, the third manufacturing method further comprises a step of forming a laterally extending bore for connecting adjacent grooves (51) at a bottom region thereof so as to leave a cavity (61) tying the plurality of grooves (51) in a row, after accomplishing the step of forming the plurality of grooves (51) arranged adjacent to each other, wherein the thermal oxidation treatment is performed to let the oxide film grow from an inside surface of the cavity (61) as well as from the inside space of the groove (51) so as to incompletely fill the inside space of the groove (51) with the thermal oxide film thus grown and turn an entire portion intervening between adjacent grooves (51) into a thermal oxide layer, and leave a smaller cavity (63) shrunken from the cavity (61). In this case, it is preferable that a width (W2) of a semiconductor material (52) intervening between two adjacent grooves (51) is 81.8% or less with respect to a groove width (W1) of the groove (51). The thermal oxidation treatment is performed together with a thermal oxidation performed for forming an element separating oxide film on an upper surface of the semiconductor substrate (1).

According to the first to third manufacturing methods, it is preferable that the thermal oxidation treatment is performed in an oxidizing atmosphere containing hydrogen at 965° C. or above.

According to the first to third manufacturing methods, it is preferable that the thermal oxidation treatment is performed in an oxidizing atmosphere containing hydrogen at 1,100° C. or above.

According to the first to third manufacturing methods, it is preferable that a reactive ion etching or a plasma etching is used in the step of forming the groove (16, 51).

According to the first to third manufacturing methods, it is preferable that the semiconductor substrate is an SOI (Silicon On Insulator) substrate.

According to the first to third manufacturing methods, it is preferable that the passive element (3) is operative at high frequencies.

What is claimed is:

1. A method for manufacturing a semiconductor substrate comprising a passive element disposed on an insulating member and an active element formed in a surficial region of said insulating member, said manufacturing method comprising:

forming a groove having a depth of 10 μm or more at a predetermined portion of said semiconductor substrate where said passive element is formed;

performing a thermal oxidation treatment to let an oxide film grow from an inside surface of said groove so as to fill an inside space of said groove with a thermal oxide film thus grown; and forming a laterally extending bore for connecting adjacent grooves at a bottom region thereof so as to leave a cavity tying said plurality of grooves in a row, after accomplishing said forming said plurality of grooves arranged adjacent to each other, wherein said thermal oxidation treatment is performed to let the oxide film grow from an inside surface of said cavity as well as from the inside space of said groove so as to fill the inside space of said groove with the thermal oxide film thus grown and leave a closed cavity shrunken from said cavity.

2. The manufacturing method of a semiconductor substrate in accordance with claim 1, wherein each groove has a groove width of 1 μm or less, and a width of a semiconductor material intervening between two adjacent grooves is 81.8% or more with respect to said groove width.

3. The manufacturing method of a semiconductor substrate in accordance with claim 1, wherein said thermal oxidation treatment is performed in an oxidizing atmosphere containing hydrogen at 965° C. or above.

4. The manufacturing method of a semiconductor substrate in accordance with claim 1, wherein said thermal oxidation treatment is performed in an oxidizing atmosphere containing hydrogen at 1,100° C. or above.

5. The manufacturing method of a semiconductor substrate in accordance with claim 1, wherein a reactive ion etching or a plasma etching is used in said forming said groove.

6. The manufacturing method of a semiconductor substrate in accordance with claim 1, wherein said semiconductor substrate is an SOI (Silicon On Insulator) substrate.

7. The manufacturing method of a semiconductor substrate in accordance with claim 1, wherein said passive element is operative at high frequencies.

8. A method for manufacturing a semiconductor substrate comprising a passive element disposed on an insulating member and an active element formed in a surficial region of said insulating member, said manufacturing method comprising:

forming a groove having a depth of 10 μm or more at a predetermined portion of said semiconductor substrate where said passive element is formed;

performing a thermal oxidation treatment to let an oxide film grow from an inside surface of said groove so as to fill an inside space of said groove with a thermal oxide film thus grown; and forming a laterally extending bore for connecting adjacent grooves at a bottom region thereof so as to leave a cavity tying said plurality of grooves in a row, after accomplishing said forming said plurality of grooves arranged adjacent to each other, wherein said thermal oxidation treatment is performed to let the oxide film grow from an inside surface of said cavity as well as from the inside space of said groove so as to fill the inside space of said groove with the thermal oxide film thus grown and turn an entire portion intervening between adjacent grooves into a thermal oxide layer, and finally leave a closed cavity shrunken from said cavity.

9. A method for manufacturing a semiconductor substrate comprising a passive element disposed on an insulating member and an active element formed in a surficial region of said insulating member, said manufacturing method comprising:

forming a plurality of grooves each having a depth of 10 μm or more and arranged adjacent to each other at a predetermined portion of said semiconductor substrate where said passive element is formed, and performing a thermal oxidation treatment to let an oxide film grow from an inside surface of said groove so as to fill an inside space of said groove with a thermal oxide film thus grown and turn an entire portion intervening between adjacent grooves into a thermal oxide layer.

10. The manufacturing method of a semiconductor substrate in accordance with claim 9, wherein each groove has a groove width of 1 μm or less, and a width of a semiconductor material intervening between two adjacent grooves is 81.8% or more with respect to said groove width.

11. The manufacturing method of a semiconductor substrate in accordance with claim 9, further comprising:

forming a laterally extending bore for connecting adjacent grooves at a bottom region thereof so as to leave a cavity tying said plurality of grooves in a row, after accomplishing said forming said plurality of grooves arranged adjacent to each other, wherein said thermal oxidation treatment is performed to let the oxide film grow from an inside surface of said cavity as well as from the inside space of said groove so as to fill the inside space of said groove with the thermal oxide film thus grown and leave a closed cavity shrunken from said cavity.

12. The manufacturing method of a semiconductor substrate in accordance with claim 9, further comprising:

forming a laterally extending bore for connecting adjacent grooves at a bottom region thereof so as to leave a cavity tying said plurality of grooves in a row, after accomplishing said forming said plurality of grooves arranged adjacent to each other, wherein said thermal oxidation treatment is performed to let the oxide film grow from an inside surface of said cavity as well as from the inside space of said groove so as to fill the inside space of said groove with the thermal oxide film thus grown and turn an entire portion intervening between adjacent grooves into a thermal oxide layer, and finally leave a closed cavity shrunken from said cavity.

13. The manufacturing method of a semiconductor substrate in accordance with claim 9, wherein said thermal oxidation treatment is performed in an oxidizing atmosphere containing hydrogen at 965° C. or above.

14. The manufacturing method of a semiconductor substrate in accordance with claim 9, wherein said thermal oxidation treatment is performed in an oxidizing atmosphere containing hydrogen at 1,100° C. or above.

15. The manufacturing method of a semiconductor substrate in accordance with claim 9, wherein a reactive ion etching or a plasma etching is used in said step of forming said groove.

16. The manufacturing method of a semiconductor substrate in accordance with claim 9, wherein said semiconductor substrate is an SOI (Silicon On Insulator) substrate.

17. The manufacturing method of a semiconductor substrate in accordance with claim 9, wherein said passive element is operative at high frequencies.

* * * * *